(12) United States Patent
Kim

(10) Patent No.: US 11,522,135 B2
(45) Date of Patent: Dec. 6, 2022

(54) ORGANIC ELECTROLUMINESCENCE DEVICE AND MANUFACTURING METHOD OF THE SAME

(71) Applicant: SAMSUNG DISPLAY CO., LTD., Yongin-si (KR)

(72) Inventor: Minkyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 645 days.

(21) Appl. No.: 16/502,091

(22) Filed: Jul. 3, 2019

(65) Prior Publication Data

US 2020/0098993 A1    Mar. 26, 2020

(30) Foreign Application Priority Data

Sep. 21, 2018   (KR) .................. 10-2018-0113538

(51) Int. Cl.
*H01L 51/00* (2006.01)
*C09K 11/06* (2006.01)
(Continued)

(52) U.S. Cl.
CPC .......... *H01L 51/0058* (2013.01); *C09K 11/06* (2013.01); *H01L 51/0067* (2013.01);
(Continued)

(58) Field of Classification Search
CPC ............ H01L 51/0058; H01L 51/0067; H01L 51/0072; H01L 51/0085; H01L 51/5016;
(Continued)

(56) References Cited

U.S. PATENT DOCUMENTS

| 9,818,950 B2 | 11/2017 | Ito et al. |
| 11,043,646 B2* | 6/2021 | Lee ...................... H01L 51/006 |
| 2012/0206037 A1 | 8/2012 | Lee et al. |
| 2016/0087224 A1 | 3/2016 | Kim et al. |
| 2016/0118590 A1 | 4/2016 | Ito et al. |
| 2016/0133852 A1 | 5/2016 | Kim |
| 2016/0308138 A1 | 10/2016 | Kim et al. |
| 2017/0125691 A1* | 5/2017 | Kim ................... H01L 51/0072 |
| 2018/0301631 A1 | 10/2018 | Yen et al. |
| 2020/0168809 A1* | 5/2020 | Kim ................... H01L 51/0069 |
| 2020/0185619 A1* | 6/2020 | Kim ..................... C07D 471/06 |
| 2020/0295271 A1* | 9/2020 | Lee .................... H01L 51/0072 |

FOREIGN PATENT DOCUMENTS

| CN | 107652307 A | 2/2018 |
| KR | 10-2011-0009920 A | 1/2011 |
| KR | 10-1352438 B1 | 1/2014 |
| KR | 10-2016-0036159 A | 4/2016 |
| KR | 10-2017-0047653 A | 5/2017 |

(Continued)

OTHER PUBLICATIONS

EPO Extended Search Report dated Feb. 11, 2020, for corresponding European Patent Application No. 19197895.6 (8 pages).

*Primary Examiner* — Douglas J McGinty
(74) *Attorney, Agent, or Firm* — Lewis Roca Rothgerber Christie LLP

(57) ABSTRACT

An organic electroluminescence device and a method of manufacturing an organic electroluminescence device, the device including a first electrode; a second electrode on the first electrode; and an emission layer between the first electrode and the second electrode, wherein the emission layer includes a first host represented by the following Formula 1, and a second host represented by one of the following Formula 2-1 to Formula 2-5:

[Formula 1]

[Formula 2-1]

[Formula 2-2]

(Continued)

-continued

[Formula 2-3]

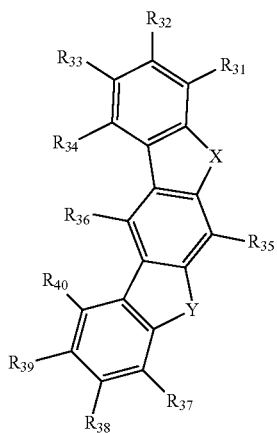

[Formula 2-5]

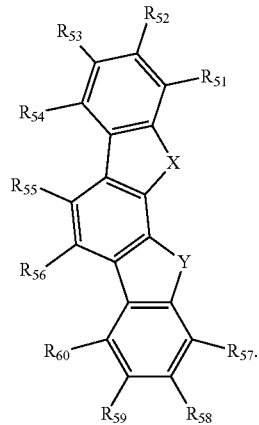

20 Claims, 4 Drawing Sheets

(51) Int. Cl.
H01L 51/50 (2006.01)
H01L 51/56 (2006.01)
(52) U.S. Cl.
CPC ...... H01L 51/0072 (2013.01); H01L 51/0085 (2013.01); C09K 2211/1029 (2013.01); C09K 2211/185 (2013.01); H01L 51/5016 (2013.01); H01L 51/5056 (2013.01); H01L 51/5072 (2013.01); H01L 51/5088 (2013.01); H01L 51/5092 (2013.01); H01L 51/5096 (2013.01); H01L 51/56 (2013.01); H01L 2251/5384 (2013.01)
(58) Field of Classification Search
CPC ............ H01L 51/5056; H01L 51/5072; H01L 51/5088; H01L 51/5092; H01L 51/5096; H01L 51/56; H01L 2251/5384; H01L 51/0052; H01L 51/5012; H01L 51/0035; H01L 51/5024; C09K 11/06; C09K 2211/1029; C09K 2211/185
USPC ........................................................ 428/690
See application file for complete search history.

[Formula 2-4]

(56) References Cited

FOREIGN PATENT DOCUMENTS

KR 10-1778046 B1 9/2017
WO WO-2021071247 A1 * 4/2021 ......... H01L 51/0071

* cited by examiner

ORGANIC ELECTROLUMINESCENCE DEVICE AND MANUFACTURING METHOD OF THE SAME

CROSS-REFERENCE TO RELATED APPLICATION

Korean Patent Application No. 10-2018-0113538, filed on Sep. 21, 2018, in the Korean Intellectual Property Office, and entitled: "Organic Electroluminescence Device and Manufacturing Method of the Same," is incorporated by reference herein in its entirety.

BACKGROUND

1. Field

Embodiments relate to an organic electroluminescence device and a manufacturing method of the same.

2. Description of the Related Art

Recently, the development of an organic electroluminescence display device as an image display device is being actively conducted. Different from a liquid crystal display device, the organic electroluminescence display device is a self-luminescent display device in which holes and electrons injected from a first electrode and a second electrode recombine in an emission layer, and a light emission material including an organic compound in the emission layer emits light to accomplish display.

In the application of an organic electroluminescence device to a display device, driving voltage may be decreased and the light-emitting efficiency and the life of the organic electroluminescence device may be increased. Developments on materials for an organic electroluminescence device stably attaining these features have been considered.

SUMMARY

The embodiments may be realized by providing an organic electroluminescence device including a first electrode; a second electrode on the first electrode; and an emission layer between the first electrode and the second electrode, wherein the emission layer includes a first host represented by the following Formula 1, and a second host represented by one of the following Formula 2-1 to Formula 2-5:

[Formula 1]

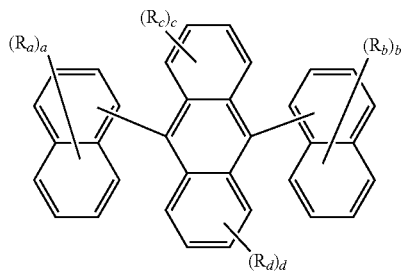

[Formula 2-1]

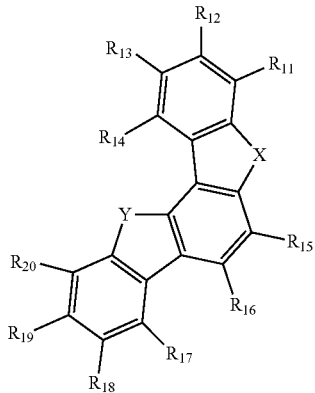

[Formula 2-2]

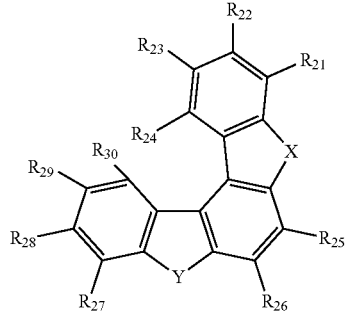

[Formula 2-3]

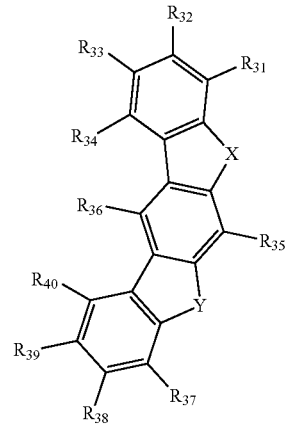

[Formula 2-4]

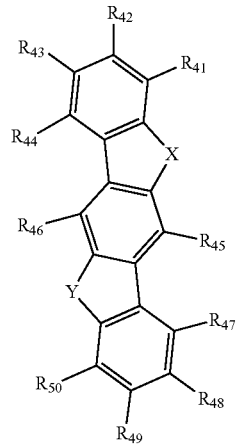

-continued

[Formula 2-5]

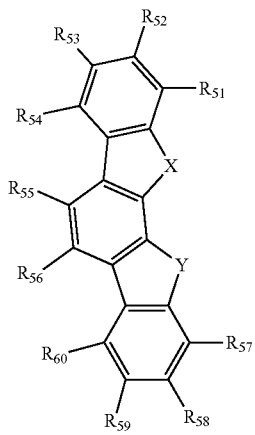

[Formula 2-1]

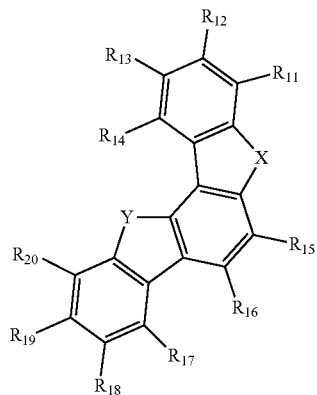

[Formula 2-2]

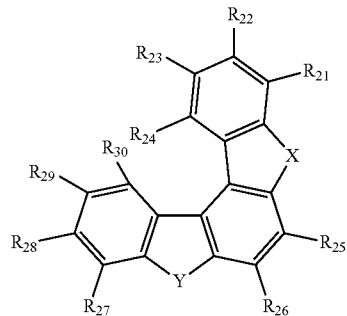

[Formula 2-3]

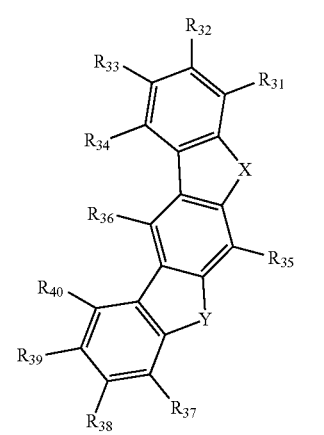

[Formula 2-4]

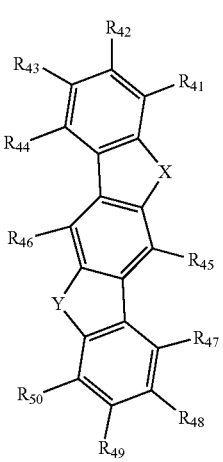

in Formula 1, $R_a$ to $R_d$ are each independently a hydrogen atom, a deuterium atom, a halogen atom, a substituted or unsubstituted silyl group, a substituted or unsubstituted germanium group, a substituted or unsubstituted alkyl group of 1 to 20 carbon atoms, a substituted or unsubstituted aryl group of 6 to 30 ring carbon atoms, or a substituted or unsubstituted heteroaryl group of 2 to 30 ring carbon atoms, "a" and "b" are each independently an integer of 0 to 7, and "c" and "d" are each independently an integer of 0 to 4, in Formula 2-1 to Formula 2-5, X and Y are each independently $NR_1$, $CR_2R_3$, or $SiR_4R_5$, provided that one of X and Y is $NR_1$, $R_1$ to $R_5$ and $R_{11}$ to $R_{60}$ are each independently a hydrogen atom, a deuterium atom, a halogen atom, a substituted or unsubstituted silyl group, a substituted or unsubstituted alkyl group of 1 to 20 carbon atoms, a substituted or unsubstituted hydrocarbon ring of 6 to 30 ring carbon atoms, or a substituted or unsubstituted heterocycle of 2 to 30 ring carbon atoms.

The embodiments may be realized by providing a method of manufacturing an organic electroluminescence device, the method including forming a hole transport region on a first electrode: forming an emission layer comprising a first host, a second host and a dopant, on the hole transport region; forming an electron transport region on the emission layer; and forming a second electrode on the electron transport region, wherein the first host is represented by the following Formula 1 and the second host is represented by any one among the following Formula 2-1 to Formula 2-5:

[Formula 1]

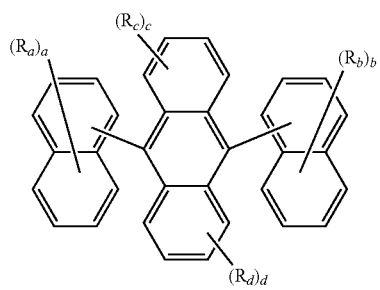

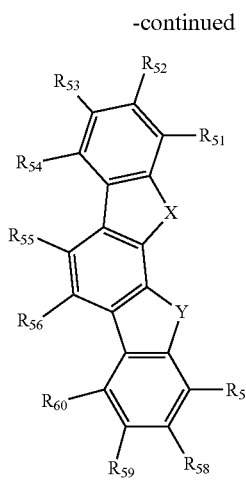

[Formula 2-5]

in Formula 1, $R_a$ to $R_d$ are each independently a hydrogen atom, a deuterium atom, a halogen atom, a substituted or unsubstituted silyl group, a substituted or unsubstituted germanium group, a substituted or unsubstituted alkyl group of 1 to 20 carbon atoms, a substituted or unsubstituted aryl group of 6 to 30 ring carbon atoms, or a substituted or unsubstituted heteroaryl group of 2 to 30 ring carbon atoms, "a" and "b" are each independently an integer of 0 to 7, and "c" and "d" are each independently an integer of 0 to 4, in Formula 2-1 to Formula 2-5, X and Y are each independently $NR_1$, $CR_2R_3$, or $SiR_4R_5$, provided that one of X and Y is $NR_1$, $R_1$ to $R_5$ and $R_{11}$ to $R_{60}$ are each independently a hydrogen atom, a deuterium atom, a halogen atom, a substituted or unsubstituted silyl group, a substituted or unsubstituted alkyl group of 1 to 20 carbon atoms, a substituted or unsubstituted hydrocarbon ring of 6 to 30 ring carbon atoms, or a substituted or unsubstituted heterocycle of 2 to 30 ring carbon atoms.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
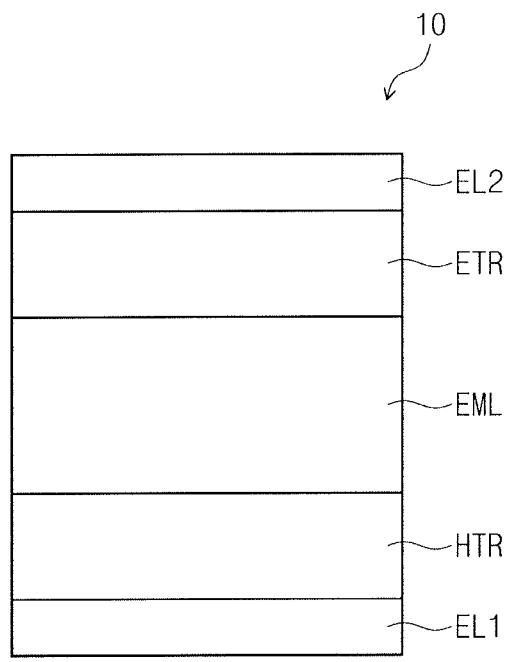
FIG. 1 illustrates a cross-sectional view of an organic electroluminescence device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will also be understood that when an element (or a region, a layer, a part, etc.) is referred to as being "on", "connected with", or "combined with" another element, it can be directly on/connected with/combined with the other element, or a third element may be present therebetween.

The terms "or" and "and/or" include one or more combinations which may be defined by relevant elements.

It will be understood that, although the terms first, second, etc. may be used herein to describe various elements, these elements should not be limited by these terms. These terms are only used to distinguish one element from another element. Thus, a first element could be termed a second element without departing from the teachings herein. Similarly, a second element could be termed a first element. As used herein, the singular forms are intended to include the plural forms as well, unless the context clearly indicates otherwise.

In addition, the terms "under", "below", "above", "on", etc. are used for explaining the correlation among elements shown in the drawings. These terms have relative concept and will be explained on the basis of the direction indicated in the drawings.

It will be understood that terms (including technical terms and scientific terms) used herein have the same meaning commonly understood by a person skilled in the art, unless otherwise defined. In addition, the terms defined in commonly used dictionaries shall be interpreted as having the meaning coincide with the meaning that is consistent with their meaning of the relevant technical idea, and shall be clearly defined herein, unless otherwise interpreted as having ideal or excessively formal meaning.

It will be further understood that the terms "includes," "including," "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment and a method of manufacturing an organic electroluminescence device of an embodiment will be explained with reference to attached drawings.

Figure 2:
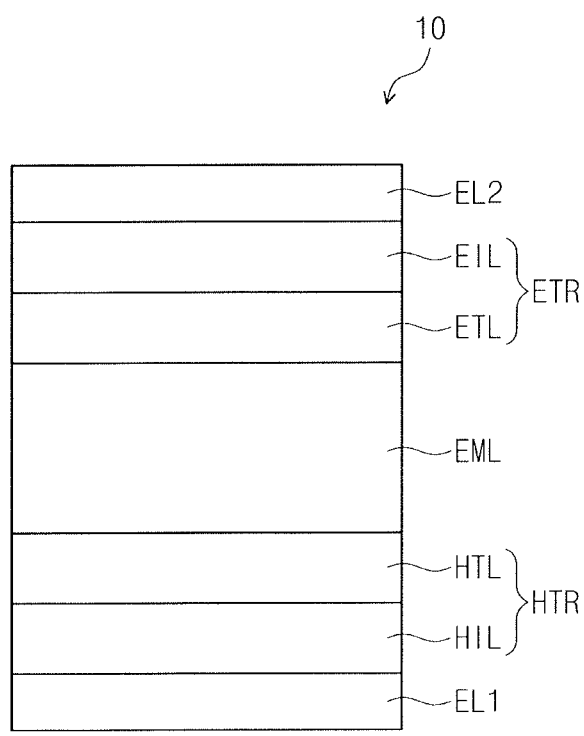
FIG. 2 illustrates a cross-sectional view of an organic electroluminescence device according to an embodiment.
Figure 3:
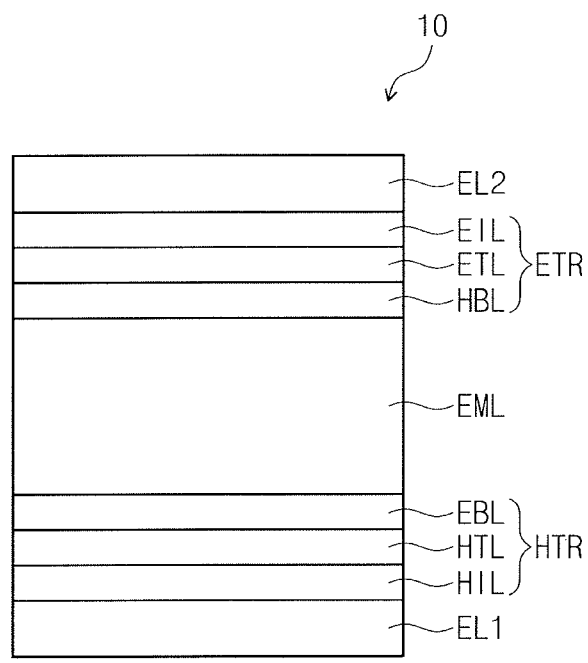
FIG. 3 illustrates a cross-sectional view of an organic electroluminescence device according to an embodiment.

FIGS. 1 to 3 illustrate cross-sectional views of organic electroluminescence devices according to exemplary embodiments. Referring to FIGS. 1 to 3, in an organic electroluminescence device 10 of an embodiment, a first electrode EL1 and a second electrode EL2 may be oppositely disposed to each other, and between the first electrode EL1 and the second electrode EL2, a plurality of organic layers may be disposed. The plurality of the organic layers may include a hole transport region HTR, an emission layer EML, and an electron transport region ETR. For example, the organic electroluminescence device 10 according to an embodiment may include the first electrode EL1, the hole transport region HTR, the emission layer EML, the electron transport region ETR, and the second electrode EL2, laminated in order.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

The first electrode EL1 has conductivity. The first electrode EL1 may be formed using a metal alloy or a conductive compound. The first electrode EL1 may be an anode. In an implementation, the first electrode EL may be a pixel electrode. The first electrode EL1 may be a transmissive electrode, a transflective electrode, or a reflective electrode. If the first electrode EL1 is the transmissive electrode, the first electrode EL1 may include a transparent metal oxide, e.g., indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In an implementation, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. The thickness of the first electrode EL1 may be from about 1,000 Å to about 10,000 Å, e.g., from about 1,000 Å to about 3,000 Å.

The hole transport region HTR may be on the first electrode EL1. The hole transport region HTR may include at least one of a hole injection layer HIL, a hole transport layer HTL, a hole buffer layer (not shown), or an electron blocking layer EBL. The thickness of the hole transport region HTR may be, e.g., from about 50 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. In an implementation, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer (now shown), hole injection layer HIL/hole buffer layer (not shown), hole transport layer HTL/hole buffer layer, or hole injection layer HIL/hole transport layer HTL/electron blocking layer EBL.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, e.g., a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris(N,-2-naphthyl)-N-phenylamino)triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,1-hexacarbonitrile (HAT-CN), etc.

The hole transport layer HTL may further include, e.g., carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[(N,N-bis(4-methylphenyl]benzenamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 50 Å to about 10,000 Å, e.g., from about 100 Å to about 5,000 Å. The thickness of the hole injection layer HIL may be, e.g., from about 30 Å to about 1,000 Å, and the thickness of the hole transport layer HTL may be from about 10 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, e.g., a p-dopant. The p-dopant may be one of quinone derivatives, metal oxides, or cyano group-containing compounds. Examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide.

As described above, the hole transport region HTR may further include at least one of a hole buffer layer (not shown) or an electron blocking layer EBL in addition to the hole injection layer HIL and the hole transport layer HTL. The hole buffer layer (not shown) may help compensate a resonance distance according to the wavelength of light emitted from the emission layer EML and increase light emission efficiency. Materials included in the hole transport region HTR may be used as materials included in the hole buffer layer (not shown). The electron blocking layer EBL is a layer playing the role of blocking the electron injection from the electron transport region ETR to the hole transport region HTR.

The emission layer EML may be on the hole transport region HTR. The emission layer EML may have a thickness of, e.g., about from 100 Å to about 1,000 Å or from about 100 Å to about 500 Å. The emission layer EML may have a single layer formed using a single material, a single layer formed using a plurality of different materials, or a multi-layer structure having a plurality of layers formed using a plurality of different materials.

In the organic electroluminescence device 10 of an embodiment, the emission layer EML may include a first host represented by the following Formula 1 and a second host represented by one of the following Formula 2-1 to Formula 2-5.

[Formula 1]

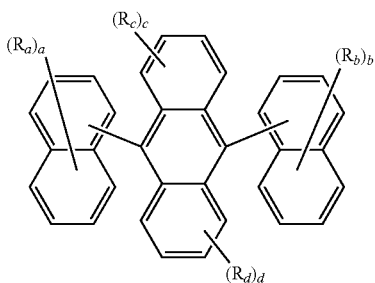

In Formula 1, $R_a$ to $R_d$ may be each independently, e.g., a hydrogen atom, a deuterium atom, a halogen atom, a substituted or unsubstituted silyl group, a substituted or unsubstituted germanium group, a substituted or unsubstituted alkyl group of 1 to 20 carbon atoms, a substituted or unsubstituted aryl group of 6 to 30 ring carbon atoms, or a substituted or unsubstituted heteroaryl group of 2 to 30 ring carbon atoms.

In Formula 1, "a" and "b" may be each independently an integer of 0 to 7, and "c" and "d" may be each independently an integer of 0 to 4. If each of "a" to "d" is an integer of 2 or more, a plurality of $R_a$ to $R_d$ may be the same or different.

In an implementation, in Formula 1, "c" and "d" may be 0. In an implementation, in Formula 1, both $R_c$ and $R_d$ may be hydrogen atoms.

Meanwhile, in the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring, an aryl group, and a heterocyclic group. In addition, each of the substituents may be substituted or unsubstituted. For example, a biphenyl group may be interpreted as an aryl group or a phenyl group substituted with a phenyl group.

In the description, examples of the halogen atom may include a fluorine atom, a chlorine atom, a bromine atom or an iodine atom.

In the description, the alkyl may be a linear, branched or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be a monocycle or a polycycle.

In the description, the hydrocarbon ring may be an optional functional group or substituent derived from an aliphatic hydrocarbon ring, or an optional functional group or substituent derived from an aromatic hydrocarbon ring. The carbon number for forming the ring in the hydrocarbon ring may be 5 to 60.

In the description, the heterocycle may be an optional functional group or substituent derived from a heterocycle including at least one heteroatom as an atom for forming a ring. The carbon number for forming the ring in the heterocycle may be 2 to 60.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the description, the heteroaryl group may include at least one of B, O, N. P, Si or S as a heteroatom. If the heteroaryl group includes two or more heteroatoms, the two or more heteroatoms may be the same or different. The heteroaryl group may be a monocyclic heterocycle or a polycyclic heterocycle. The carbon number for forming a ring of the heteroaryl may be 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc.

In the description, the silyl group includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc.

In the description, "-*" means a connecting part.

The compound represented by Formula 1 may be represented by Formula 1-1 or Formula 1-2, below. For example, the first host included in the emission layer EML may include at least one compound of the following Formula 1-1 or Formula 1-2:

[Formula 1-1]

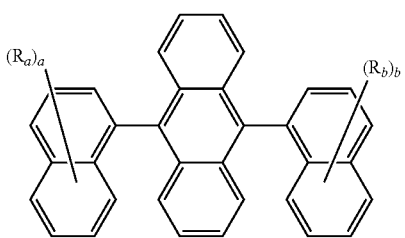

[Formula 1-2]

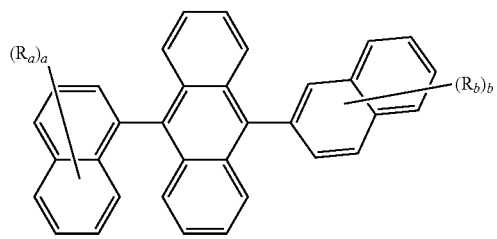

In Formula 1-1 and Formula 1-2, the same explanation referring to Formula 1 may be applied to $R_a$, $R_b$, "a" and "b".

For example, in the organic electroluminescence device 10 of an embodiment, the emission layer EML may include a first host having an anthracene core. For example, in the organic electroluminescence device 10 of an embodiment, the emission layer EML may include a first host having an anthracene core that is substituted with two substituted or unsubstituted naphthyl groups.

In an implementation, in the organic electroluminescence device 10 of an embodiment, the emission layer EML may include a compound of the following Compound Group 1 as the first host:

[Compound Group 1]

H1-1

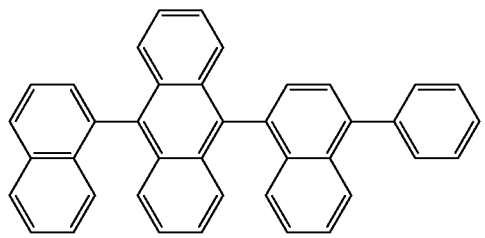

H1-2

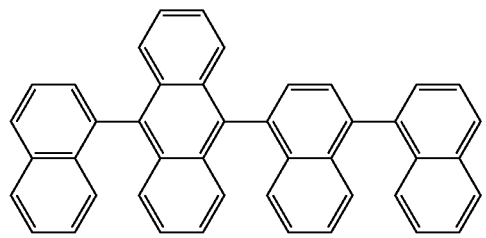

H1-3

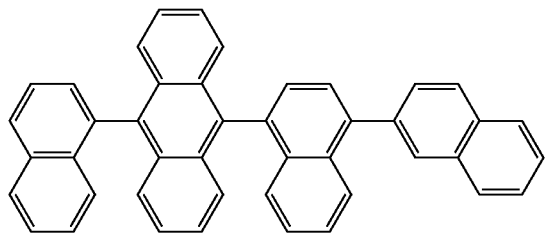

H1-4

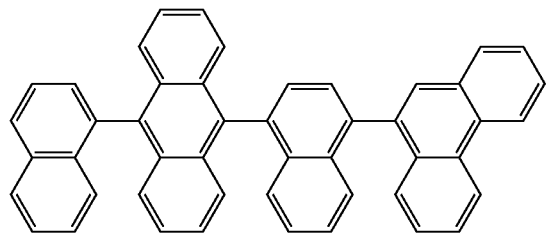

H1-5

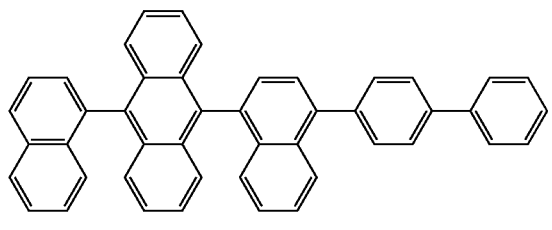

H1-6

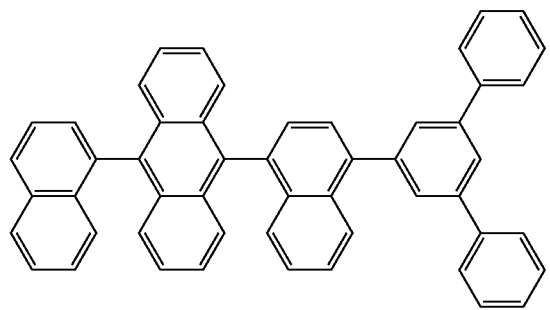

H1-7

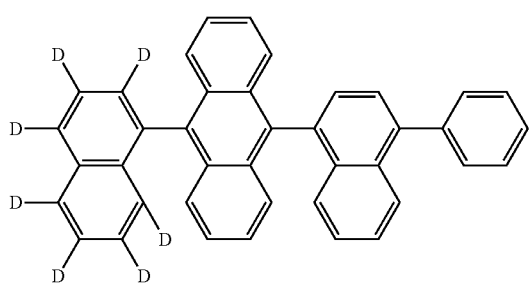

H1-8

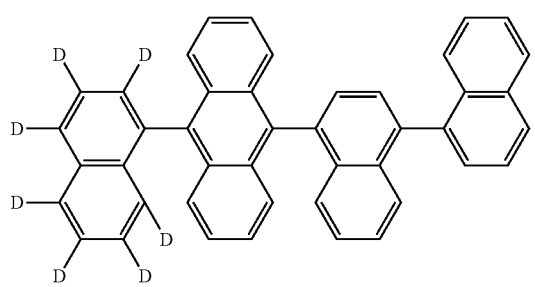

-continued
H1-9
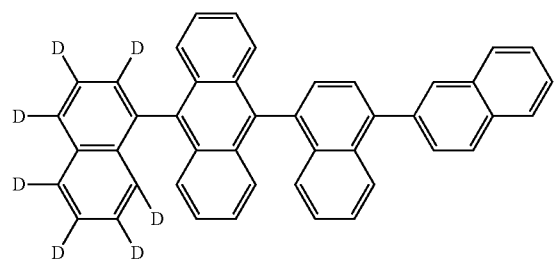
H1-10
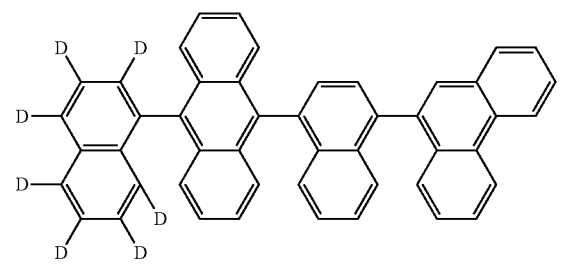
H1-11
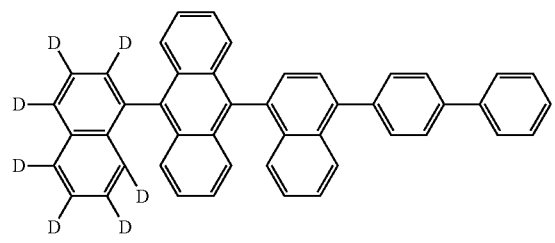
H1-12
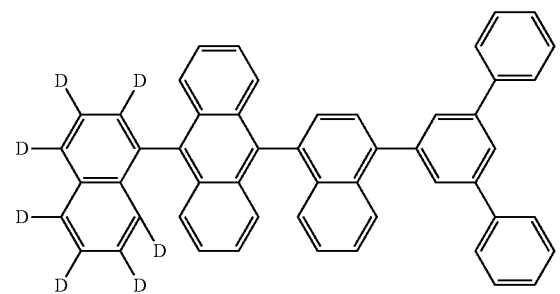
H1-13
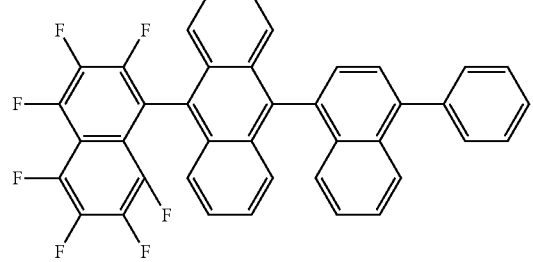
H1-14
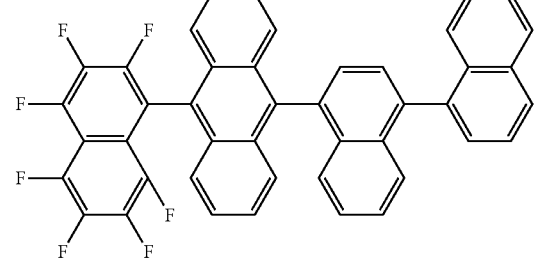
H1-15
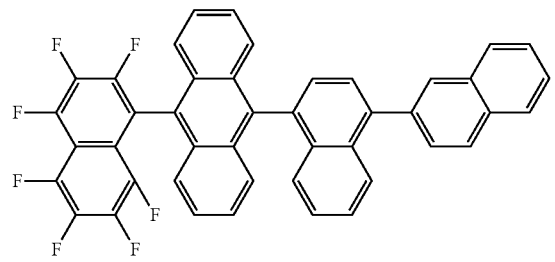
H1-16
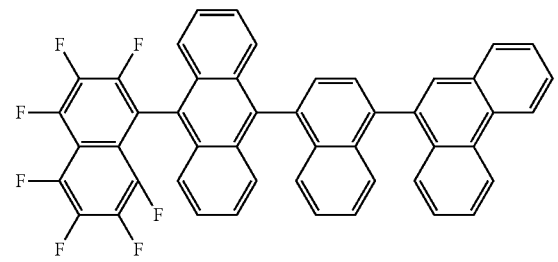
H1-17
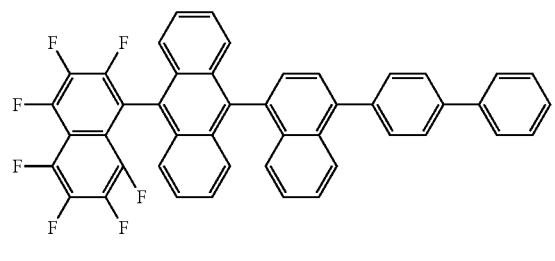
H1-18
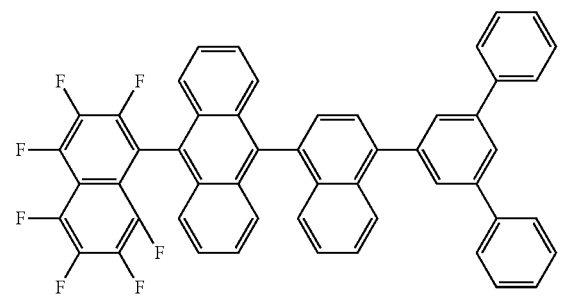

-continued
H1-19
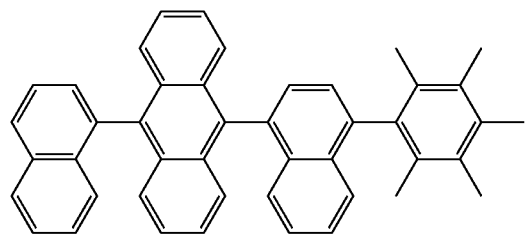
H1-20
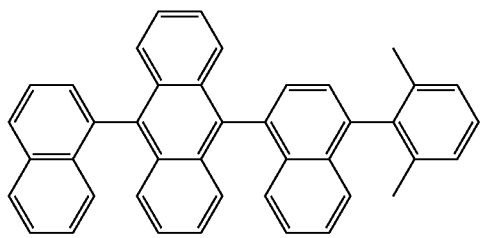
H1-21
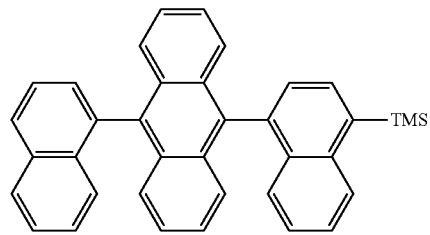
H1-22
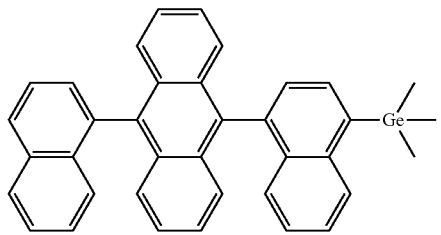
H1-23
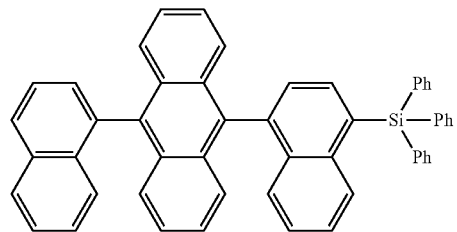
H1-24
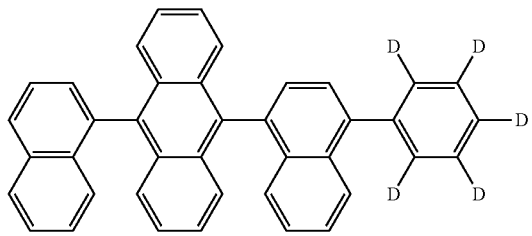
H1-25
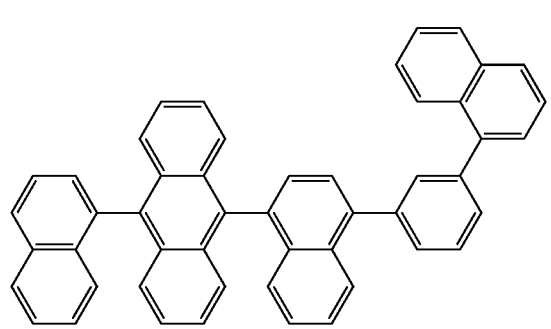
H1-26
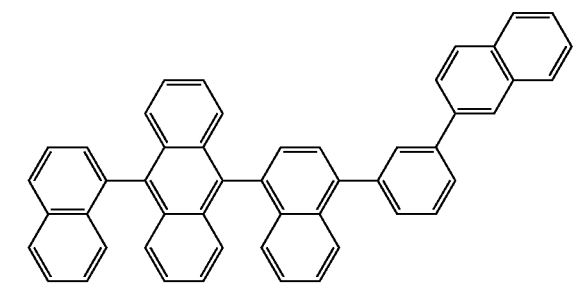
H1-27
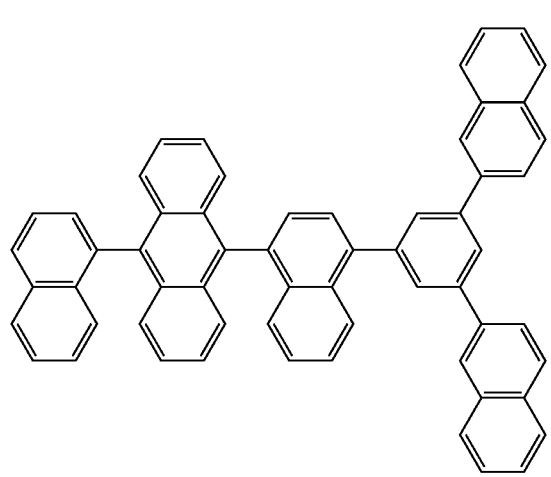
H1-28
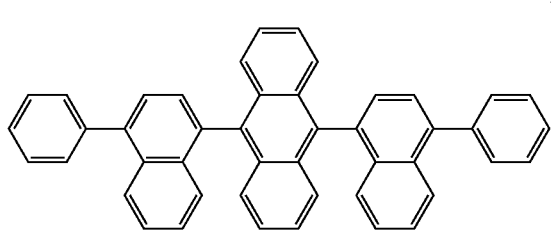

-continued
H1-29
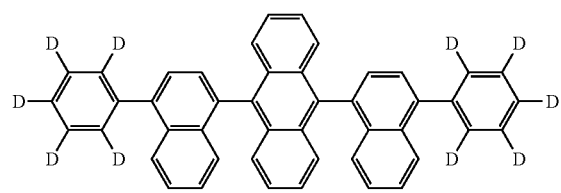
H1-30
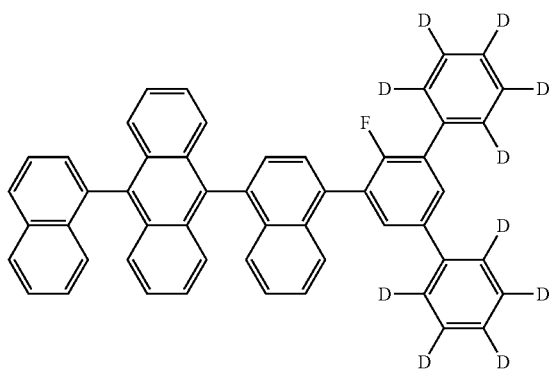
H1-31
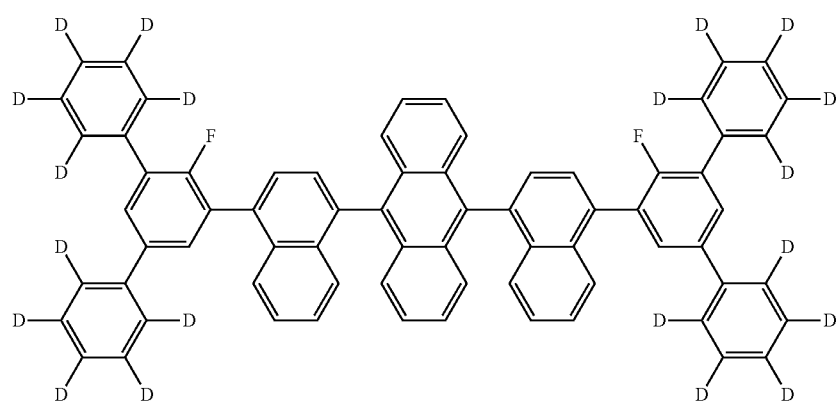
H1-32
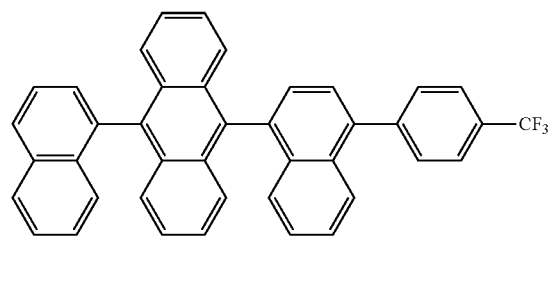
H1-33
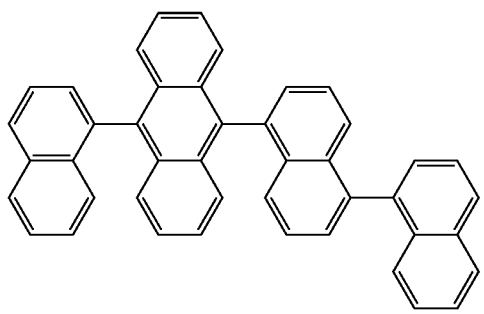
H1-34
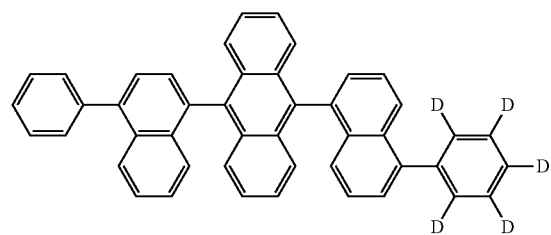
H1-35
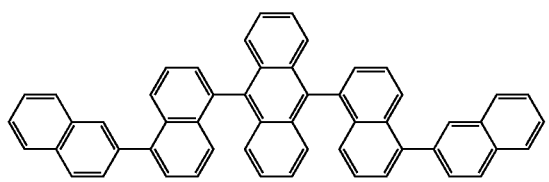

-continued
H1-36
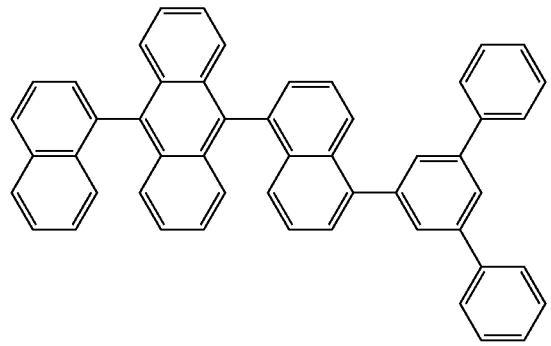
H1-37
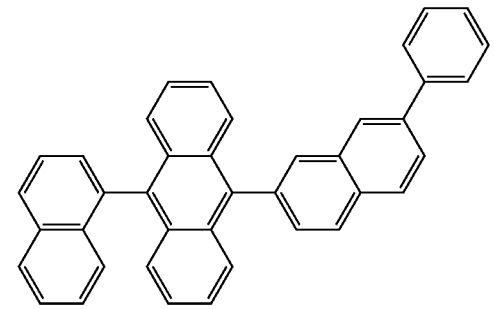
H1-38
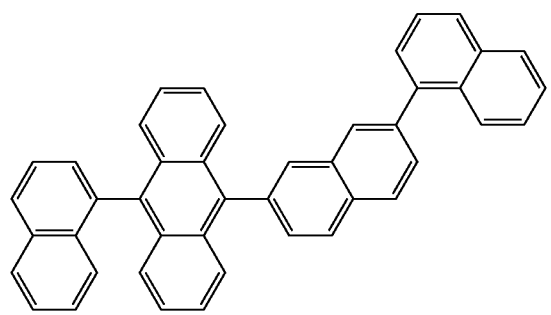
H1-39
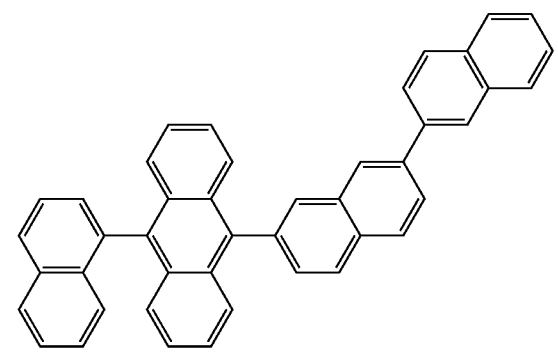
H1-40
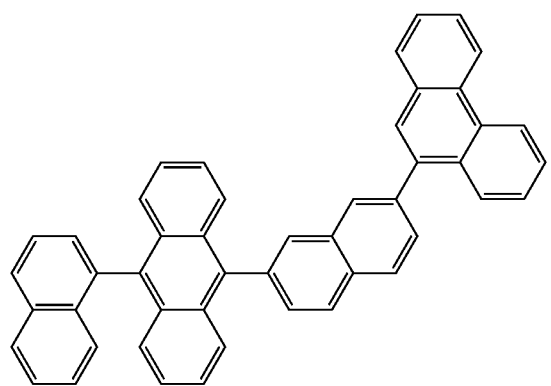
H1-41
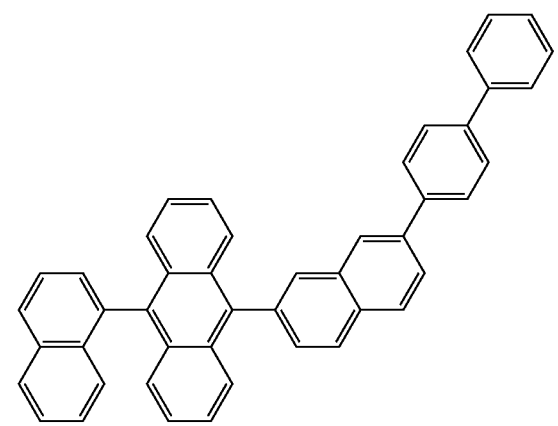
H1-42
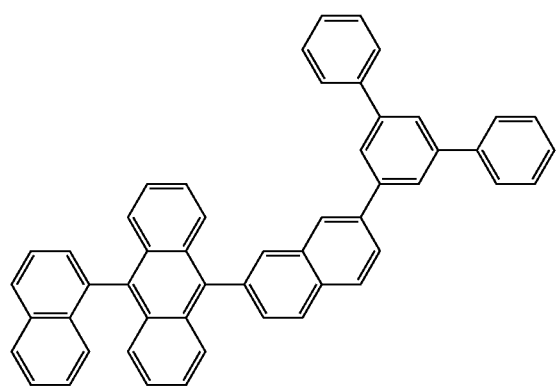
H1-43
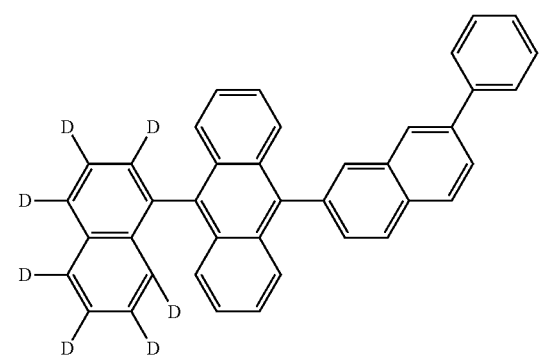

H1-44

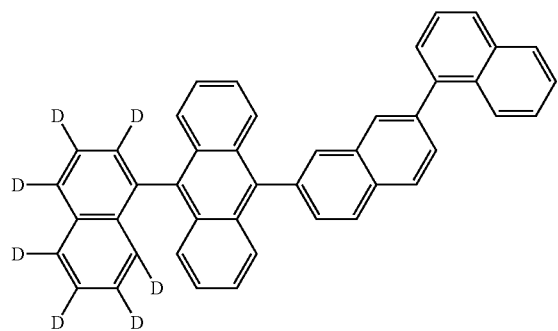

H1-45

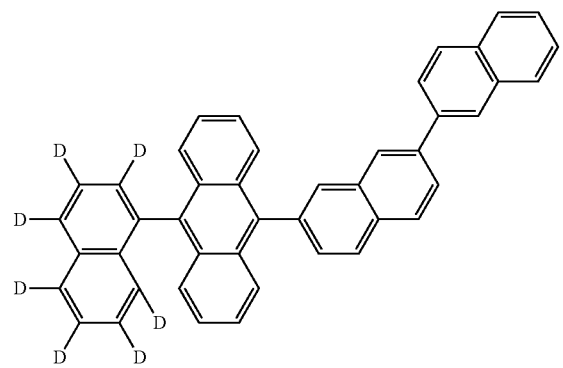

In Compound H1-1 to Compound H1-45, shown in Compound Group 1, "D" represents a deuterium atom, "Ph" corresponds to a phenyl group, and "TMS" represents a trimethylsilyl group.

In the organic electroluminescence device 10 of an embodiment, the second host included in the emission layer EML may be represented by one of the following Formula 2-1 to Formula 2-5.

[Formula 2-1]

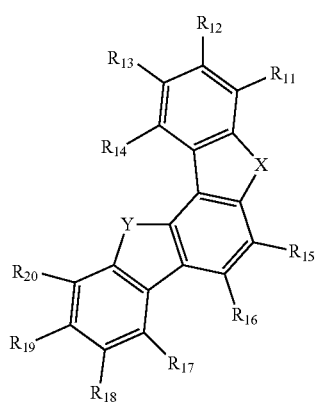

[Formula 2-2]

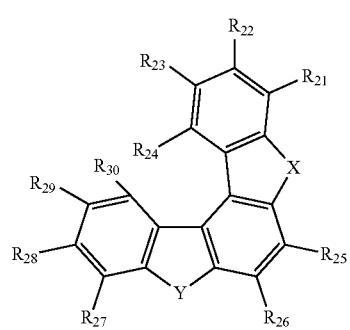

[Formula 2-3]

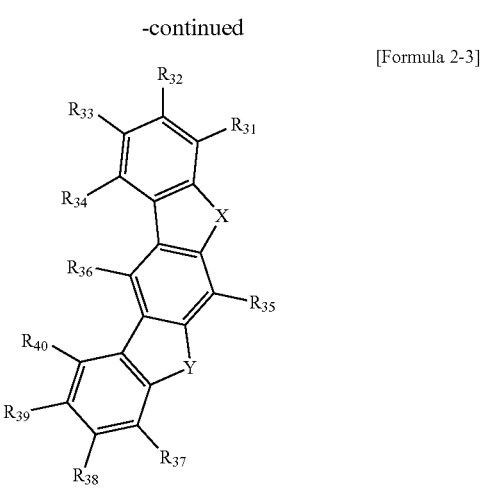

[Formula 2-4]

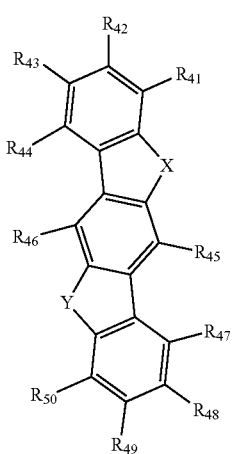

[Formula 2-5]

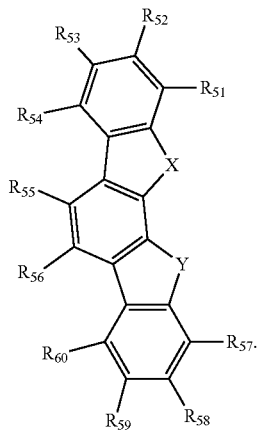

In Formula 2-1 to Formula 2-5, X and Y may each independently be, e.g., $NR_1$, $CR_2R_3$, or $SiR_4R_5$. In an implementation, one of X and Y is $NR_1$, and the remainder or other is $CR_2R_3$ or $SiR_4R_5$. In Formula 2-1 to Formula 2-5, $R_1$ to $R_5$ and $R_{11}$ to $R_{60}$ may each independently be, e.g., a hydrogen atom, a deuterium atom, a halogen atom, a substituted or unsubstituted silyl group, a substituted or unsubstituted alkyl group of 1 to 20 carbon atoms, a substituted or unsubstituted hydrocarbon ring of 6 to 30 ring carbon atoms, or a substituted or unsubstituted heterocycle of 2 to 30 ring carbon atoms.

In an implementation, $R_1$ to $R_5$ and $R_{11}$ to $R_{60}$ may be each independently, e.g., a hydrogen atom, a deuterium atom, a halogen atom, a substituted or unsubstituted silyl group, a substituted or unsubstituted alkyl group of 1 to 10 carbon atoms, a substituted or unsubstituted hydrocarbon ring of 6 to 30 ring carbon atoms, or a substituted or unsubstituted heterocycle of 2 to 30 ring carbon atoms.

In an implementation, $R_1$ to $R_5$ and $R_{11}$ to $R_{60}$ may be each independently, e.g., an alkyl group such as a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted hexyl group, a substituted or unsubstituted ethylhexyl group, a substituted or unsubstituted heptyl group, and a substituted or unsubstituted octyl group.

In an implementation, $R_1$ to $R_5$, and $R_{11}$ to $R_{60}$ may be each independently, e.g., an aryl group such as a substituted or unsubstituted phenyl group, a substituted or unsubstituted naphthyl group, a substituted or unsubstituted fluorenyl group, a substituted or unsubstituted biphenyl group, a substituted or unsubstituted phenanthryl group, a substituted or unsubstituted terphenyl group, a substituted or unsubstituted pyrenyl group, a substituted or unsubstituted perylenyl group, a substituted or unsubstituted spirobifluorenyl group, a substituted or unsubstituted fluoranthenyl group, a substituted or unsubstituted chrysenyl group, and a substituted or unsubstituted triphenylenyl group.

In an implementation, at least one of $R_1$ to $R_5$ and $R_{11}$ to $R_{60}$ may be, e.g., a substituted or unsubstituted heterocycle including a nitrogen atom as an atom for forming a ring, or a substituted or unsubstituted arylamine group.

In an implementation, at least one of $R_1$ to $R_5$ and $R_{11}$ to $R_{60}$ may be, e.g., a group represented by one of the following H1 to H110.

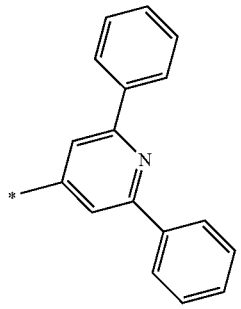
H1

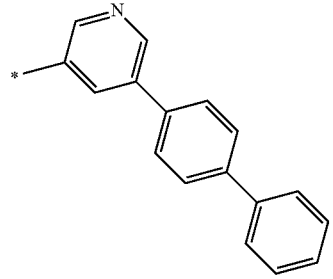
H2

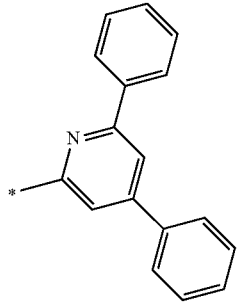
H3

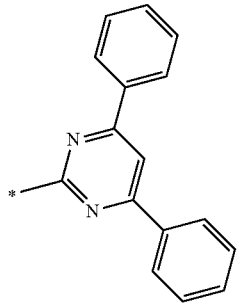
H4

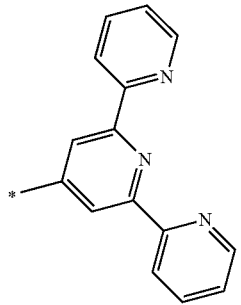
H5

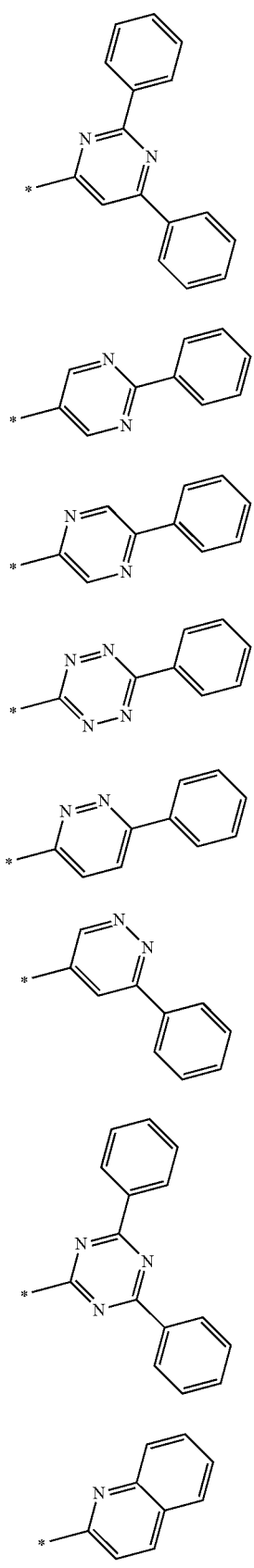
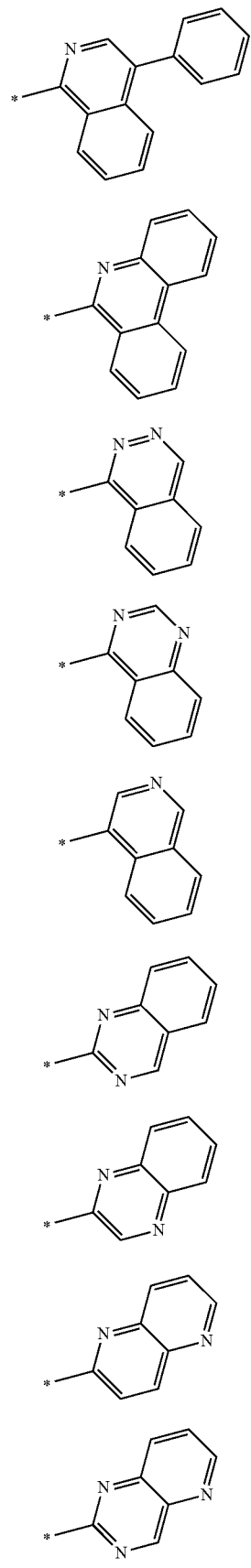

-continued
| | |
|---|---|
| 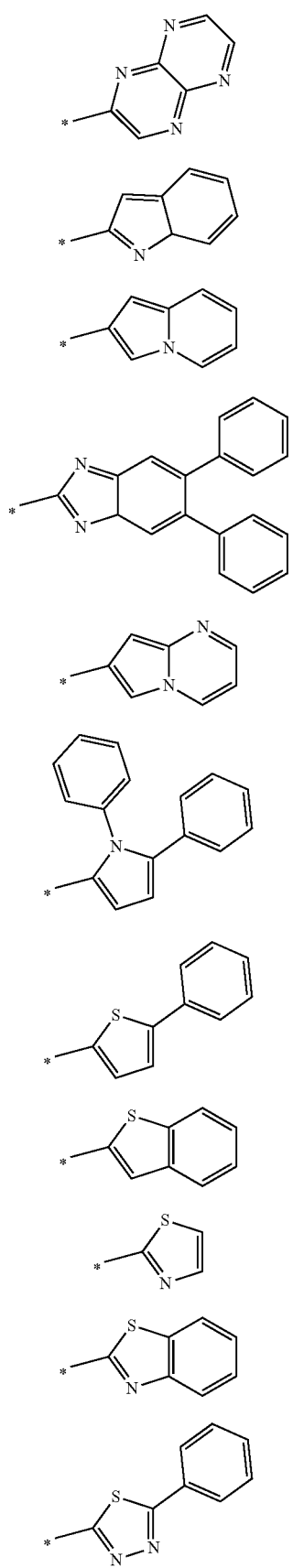 | H23 H24 H25 H26 H27 H28 H29 H30 H31 H32 H33 |
-continued
| | |
|---|---|
| 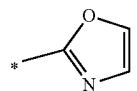 | H34 |
| 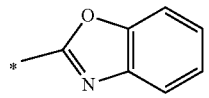 | H35 |
| 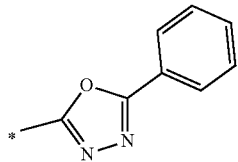 | H36 |
| 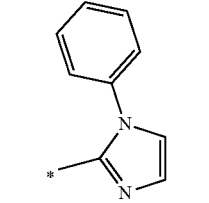 | H37 |
| 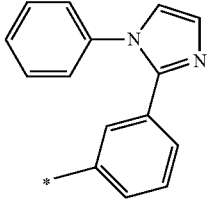 | H38 |
| 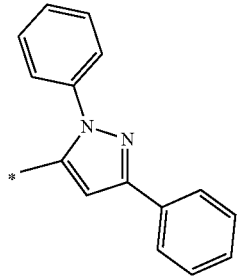 | H39 |
| 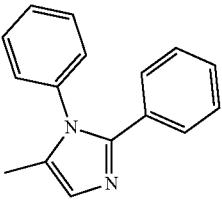 | H40 |
| 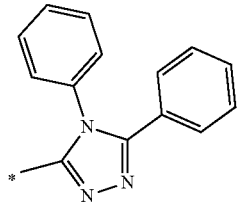 | H41 |

H42 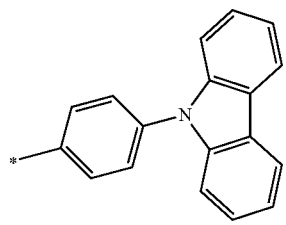
H43 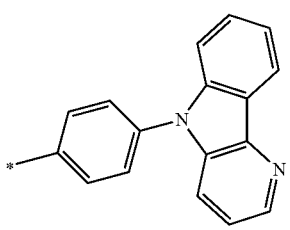
H44 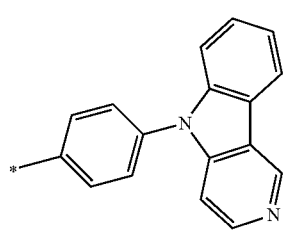
H45 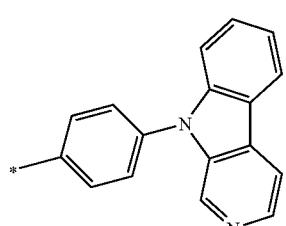
H46 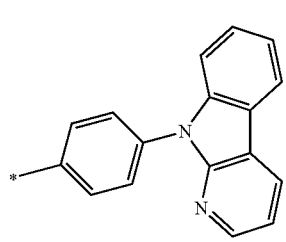
H47 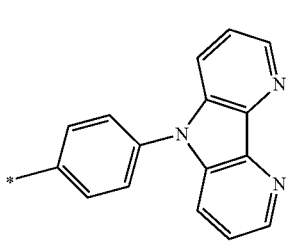
H48 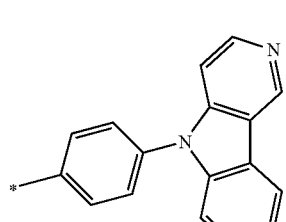
H49 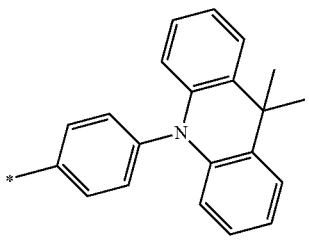
H50 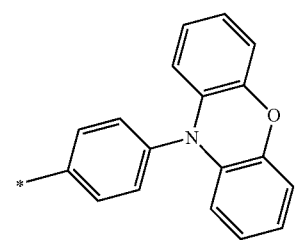
H51 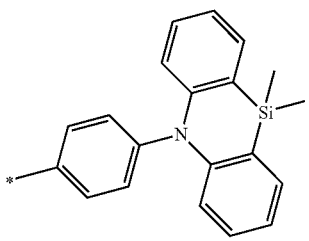
H52 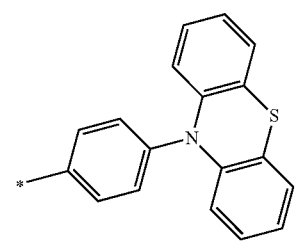
H53 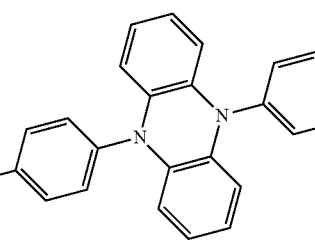
H54 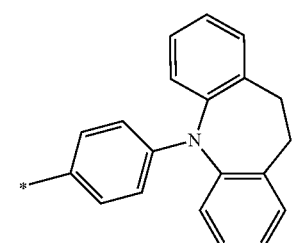

-continued
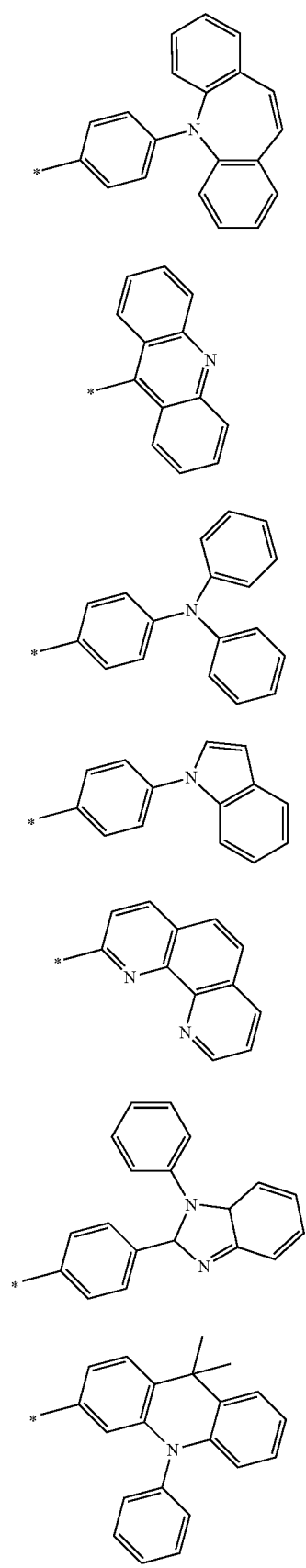
H55
H56
H57
H58
H59
H60
H61
-continued
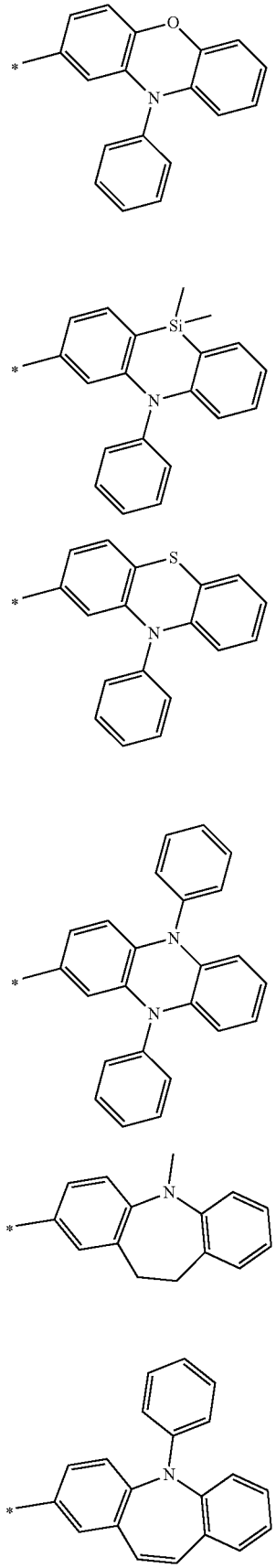
H62
H63
H64
H65
H66
H67

| | |
|---|---|
| H68 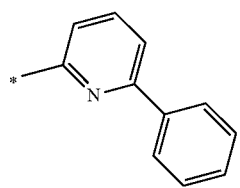 | H77 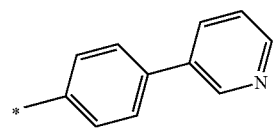 |
| H69 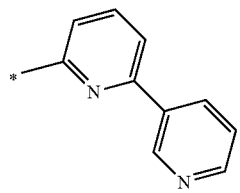 | H78 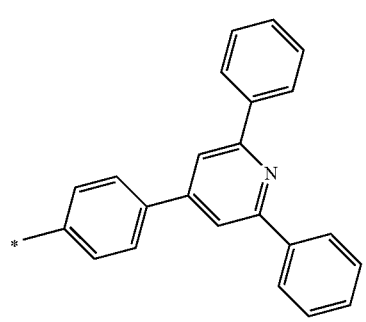 |
| H70 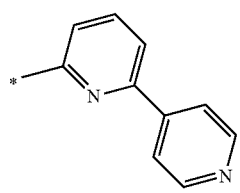 | |
| H71 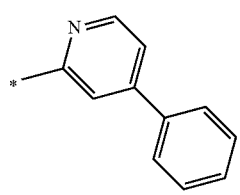 | H79 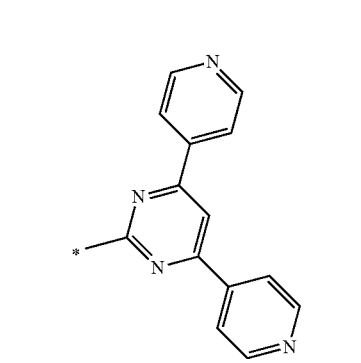 |
| H72 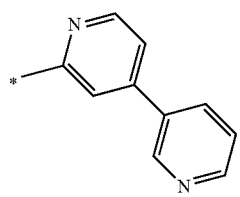 | |
| H73 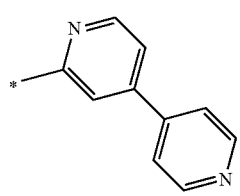 | H80 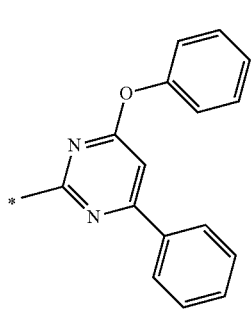 |
| H74 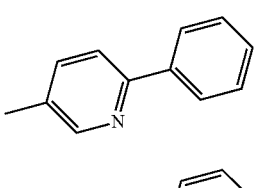 | |
| H75 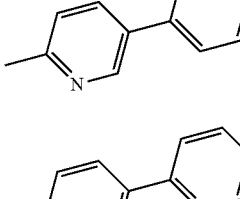 | H81 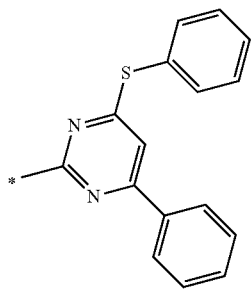 |
| H76 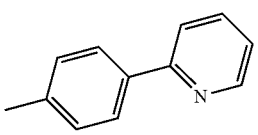 | |

H82 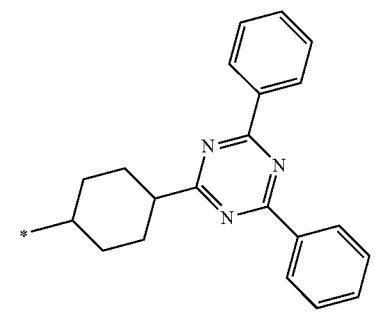
H83 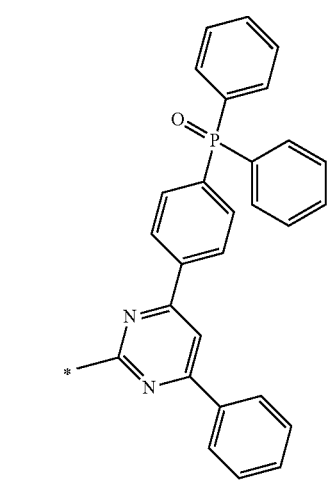
H84 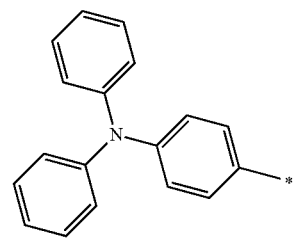
H85 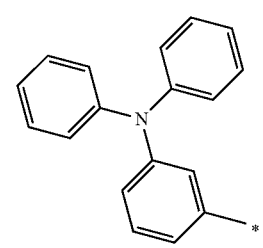
H86 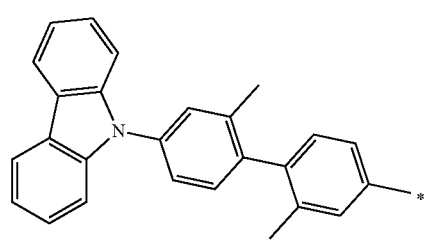
H87 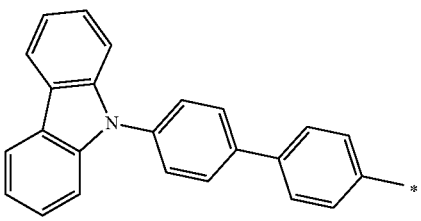
H88 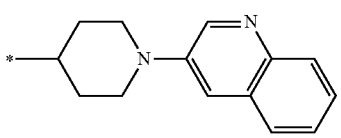
H89 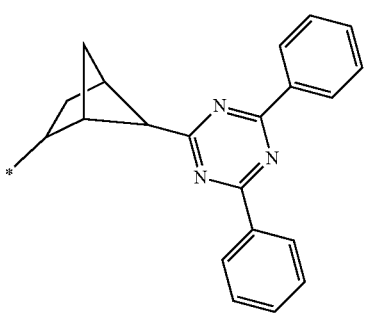
H90 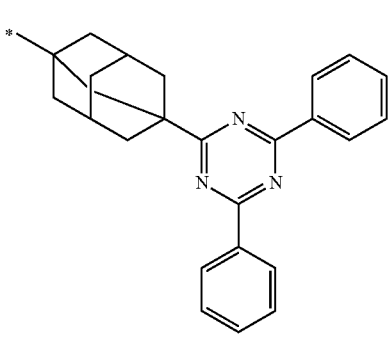
H91 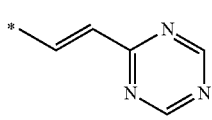
H92 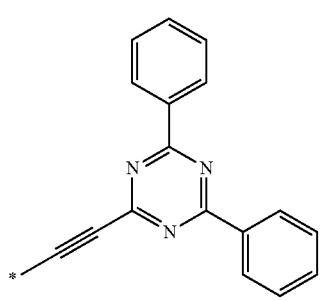

-continued
H93
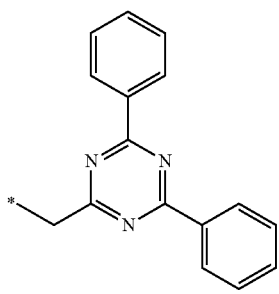
H94
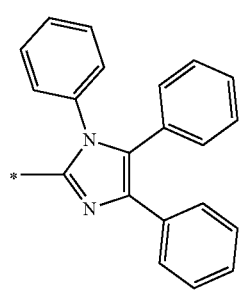
H95
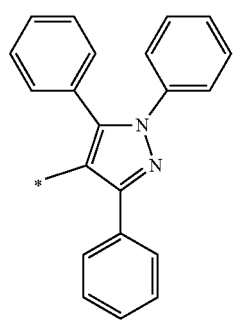
H96
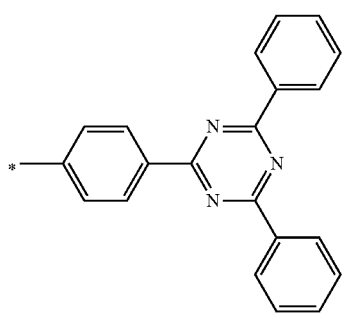
H97
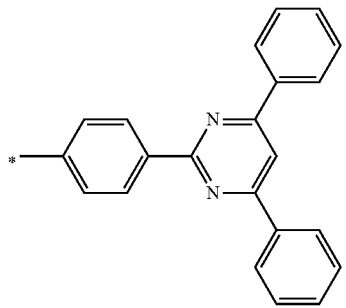
-continued
H98
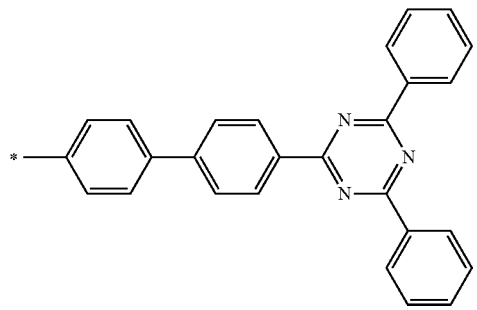
H99
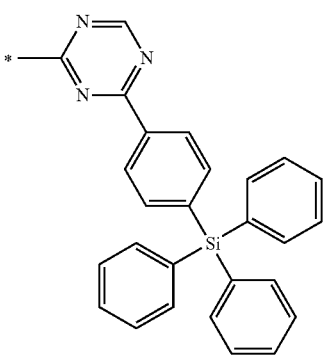
H100
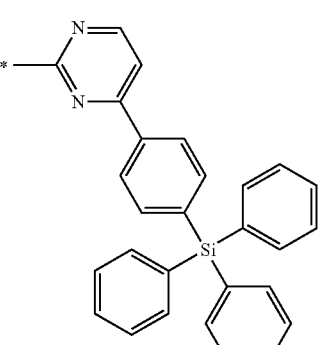
H101
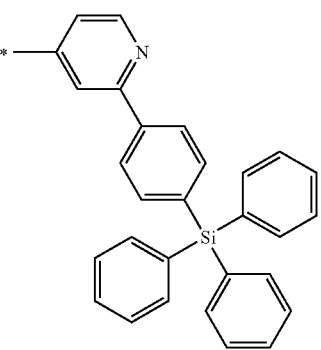

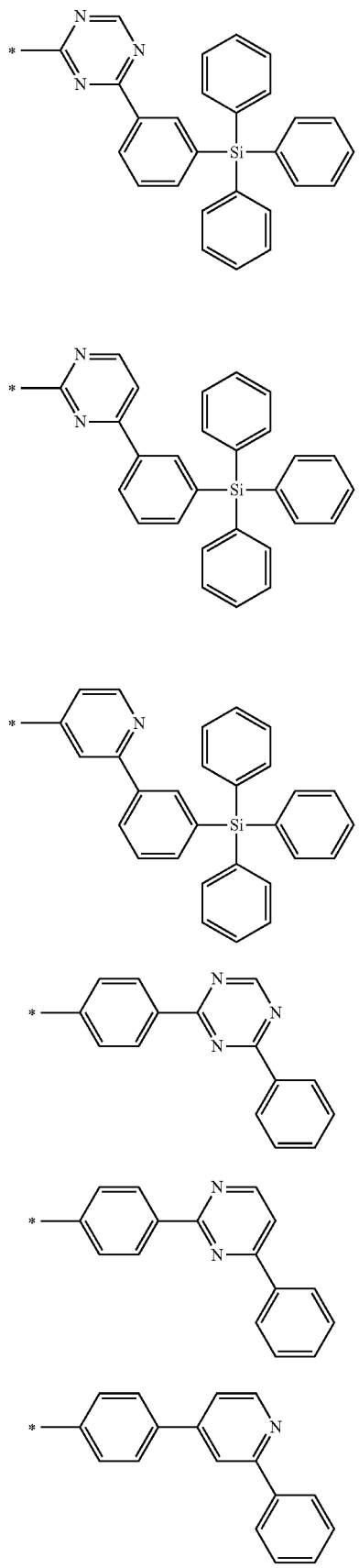

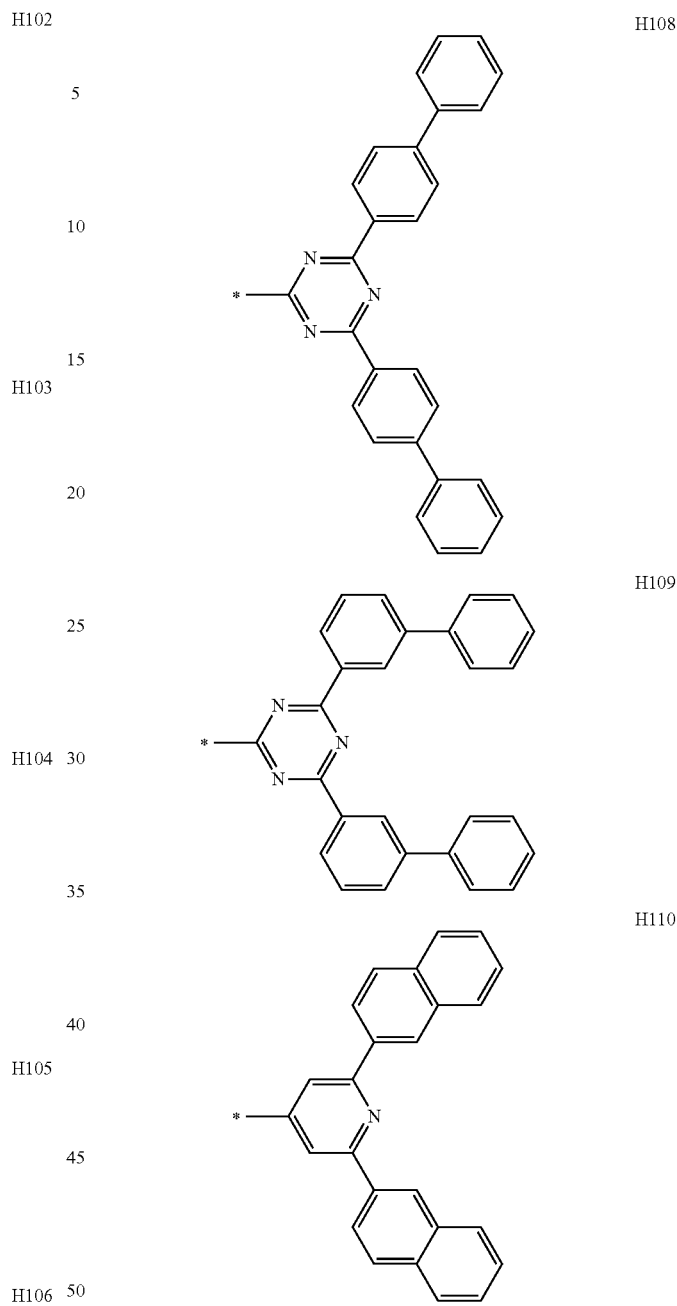

In the organic electroluminescence device 10 of an embodiment, the emission layer EML may include at least one of the compounds represented by H2-1 to H2-12, below, as the second host. In an implementation, Formula 2-1 to Formula 2-5 may be represented by any one among H2-1 to H2-12 below.

In an implementation, Formula 2-1 may be represented by any one among Formula H2-1 to Formula H2-4. In an implementation, Formula 2-2 may be represented by Formula H2-5 or Formula H2-6, and Formula 2-3 may be represented by Formula H2-7 or Formula H2-8. Formula 2-4 may be represented by Formula H2-9 or Formula H2-10, and Formula 2-5 may be represented by Formula H2-11 or Formula H2-12.

H2-1 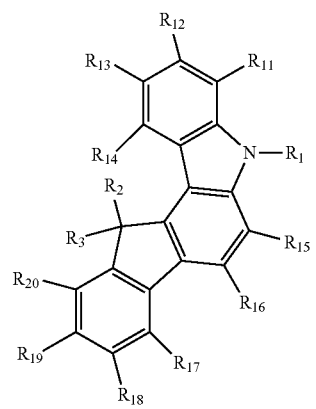
H2-2 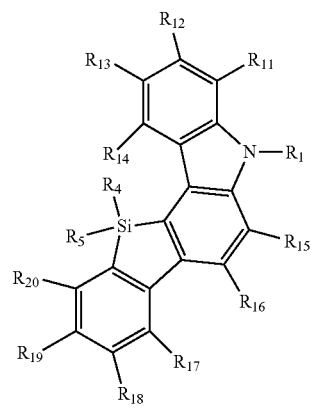
H2-3 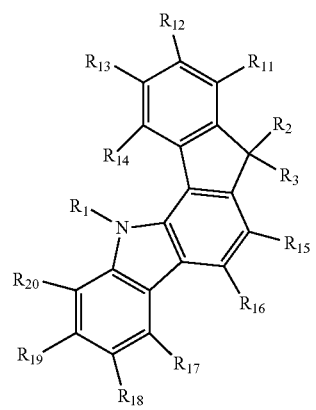
H2-4 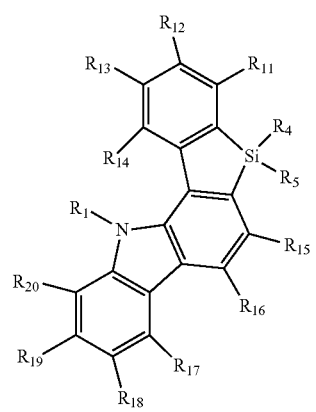
H2-5 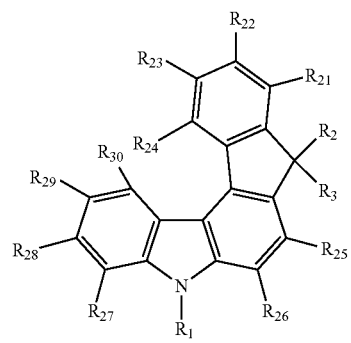
H2-6 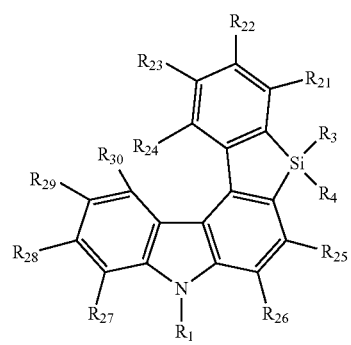
H2-7 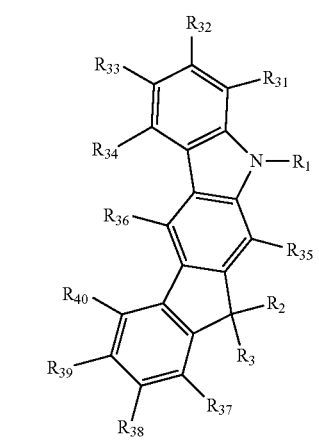
H2-8 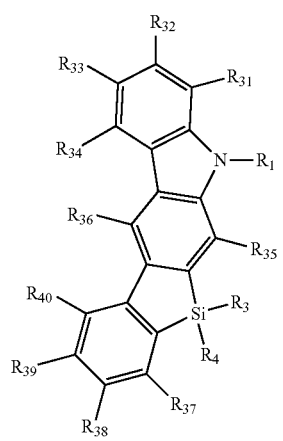

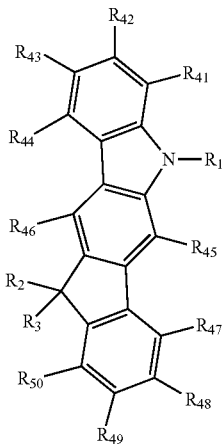

H2-9

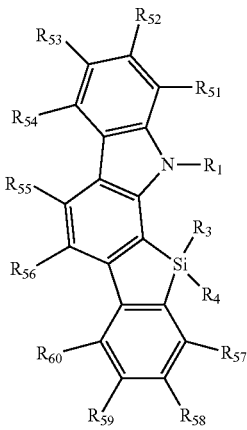

H2-12

In an implementation, in Formula H2-1 to Formula H2-12, the same explanation referring to Formula 2-1 to Formula 2-5 may be applied to $R_1$ to $R_5$, and $R_{11}$ to $R_{60}$.

In the organic electroluminescence device 10 of an embodiment, the emission layer EML may include the first host represented by Formula 1 and the second host represented by any one among Formula 2-1 to Formula 2-5 together.

For example, the organic electroluminescence device 10 of an embodiment may include both the first host and the second host in the emission layer EML, and may keep excellent emission efficiency and increase device life when compared with a case using the first host or the second host alone. The organic electroluminescence device 10 of an embodiment includes both the first host and the second host, the injection of holes and electrons into the emission layer EML may become favorable, and charge balance in the emission layer EML may be improved, thereby achieving a low driving voltage, high emission efficiency and long life characteristics.

In an implementation, the first host and the second host included in the emission layer EML may produce an exciplex. An exciplex produced from a mixed host material of two hosts of the first host and the second host, which have different properties from each other, may have a new energy level, which is different from that of each of the first host and the second host in the emission layer EML. For example, the exciplex produced by the mixed host material of the first host and the second host may have a new triplet energy level that is different from that of the first host and the second host.

In the organic electroluminescence device 10 of an embodiment, the amount of the first host may be larger than the amount of the second host in the emission layer EML. For example, in the organic electroluminescence device 10 of an embodiment, the emission layer EML may include the first host and the second host in a weight ratio of 50:40 to 80:10. In the organic electroluminescence device 10 of an embodiment, the emission layer EML includes the first host and the second host in a weight ratio of 50:40 to 80:10 to keep excellent emission efficiency and improve device life characteristics.

In the organic electroluminescence device 10 of an embodiment, the emission layer EML may further include a dopant in addition to the first host and the second host. In an implementation, the emission layer EML may include the host and the dopant in a weight ratio of 59:41 to 95:5. For example, the total weight of the host may be larger than the weight of the dopant, and if the amount of the dopant is at least about 5% when compared with the total amount of the host and the dopant, appropriate emission properties may be shown. In an implementation, the weight ratio of the host and the dopant may be 59:41 to 95:5.

In this case, the amount of the host corresponds to the total amount of the first host and the second host. For example, the emission layer EML may include the total of the first host and the second host, and the dopant in a weight ratio of 59:41 to 95:5.

In an implementation, if the weight ratio of the total of the first host and the second host, with respect to the dopant is fixed to 90:10, the weight ratio of first host:second host: dopant may be 50:40:10 to 80:10:10.

In the organic electroluminescence device 10 of an embodiment, the emission layer EML may emit phosphorescence. In an implementation, the emission layer EML may further include a phosphorescence dopant in addition to the first host and the second host.

In an implementation, the emission layer EML may include a metal complex including iridium (Ir), platinum (Pt), osmium (Os), gold (Au), palladium (Pd), titanium (Ti), zirconium (Zr), hafnium (Hf), europium (Eu), terbium (Tb), or thulium (Tm) as a phosphorescence dopant. For example, the phosphorescence dopant may be a metal complex including iridium (Ir), osmium (Os), platinum (Pt), or palladium (Pd) as a central atom. In an implementation, iridium(III) bis(4,6-difluorophenylpyridinato-N,C2')picolinate (FIrpic), bis(2,4-difluorophenylpyridinato) (Fir6), or platinum octaethyl porphyrin (PtOEP) may be used as the phosphorescence dopant.

The emission layer EML of the organic electroluminescence device 10 of an embodiment may emit light in a green wavelength region. In an implementation, the emission layer EML may emit blue light or red light.

The emission layer EML of the organic electroluminescence device 10 of an embodiment may be a green phosphorescence emission layer. For example, the emission layer EML of the organic electroluminescence device 10 of an embodiment may include a first host represented by Formula 1, a second host represented by any one among Formula 2-1 to Formula 2-5, and a phosphorescence dopant represented by any one among D1 to D3 below, and may emit green phosphorescence.

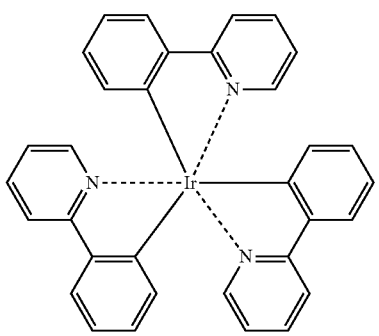

D1

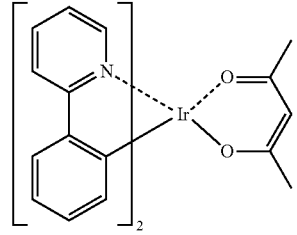

D2

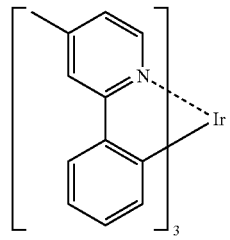

D3

In an implementation, the organic electroluminescence device 10 of an embodiment may include a plurality of emission layers. The plurality of emission layers may be laminated one by one and provided. In an implementation, the organic electroluminescence device 10 including the plurality of emission layers and may emit white light. The organic electroluminescence device including the plurality of emission layers may be an organic electroluminescence device having a tandem structure. At least one emission layer among the plurality of emission layers may include the first host represented by Formula 1, the second host represented by any one among Formula 2-1 to Formula 2-5, and the dopant, as described above.

In the organic electroluminescence device 10 of an embodiment shown in FIGS. 1 to 3, the electron transport region ETR may be on the emission layer EML. The electron transport region ETR may include at least one of a hole blocking layer HBL, an electron transport layer ETL or an electron injection layer EIL.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In an implementation, the electron transport region ETR may have a single layer structure having a plurality of different materials, or a structure laminated from the emission layer EML of electron transport layer ETL/ electron injection layer EIL, or hole blocking layer HBL/ electron transport layer ETL/electron injection layer EIL. The thickness of the electron transport region ETR may be, e.g., from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include and anthracene-based compound. The electron transport layer may include, e.g., tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di (naphthalene-2-yl)anthracene (ADN), or a mixture thereof. The thickness of the electron transport layer ETL may be from about 100 Å to about 1,000 Å, e.g., from about 150 Å to about 500 Å. If the thickness of the electron transport layer ETL satisfies the above-described range, satisfactory electron transport properties may be obtained without substantial increase of a driving voltage.

If the electron transport region ETR may include the electron injection layer EIL, the electron transport region ETR may include LiF, 8-hydroxyquinolinolato-lithium (LiQ), Li$_2$O, BaO, NaCl, CsF, a metal in lanthanoides such as Yb, or a metal halide such as RbCl and RbI. The electron injection layer EIL may be also formed using a mixture material of an electron transport material and an insulating organo metal salt. The organo metal salt may be a material having an energy band gap of about 4 eV or more. Particularly, the organo metal salt may include, e.g., metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, e.g., at least one of 2,9-dimethyl-4,7-diphenyl-1,10-phenanthroline (BCP), or 4,7-diphenyl-1,10-phenanthroline (Bphen).

The second electrode EL2 may be on the electron transport region ETR. The second electrode EL2 may be a common electrode or an anode. The second electrode EL2 may be a transmissive electrode, a transflective electrode or a reflective electrode. If the second electrode EL2 is the transmissive electrode, the second electrode EL2 may include a transparent metal oxide, e.g., ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In an implementation, the second electrode EL2 may be connected with an auxiliary electrode. If the second electrode EL2 is connected with the auxiliary electrode, the resistance of the second electrode EL2 may decrease.

In an implementation, on the second electrode EL2 of the organic electroluminescence device 10 of an embodiment, a capping layer (not shown) may be further disposed. The capping layer (not shown) may include. e.g., α-NPD, NPB. TPD, m-MTDATA, Alq3, CuPc, N4,N4,N4',N4'-tetra(biphenyl-4-yl)biphenyl-4,4'-diamine (TPD15), 4,4',4"-tris(carbazol sol-9-yl) triphenylamine) (TCTA), N,N'-bis(naphthalen-1-yl), etc.

In the organic electroluminescence device 10 according to an embodiment, the emission layer EML may include two different host materials together, and may show improved emission efficiency and life properties when compared with a case using a single host. For example, the organic electroluminescence device 10 of an embodiment may include a first host of an anthracene derivative, represented by Formula 1, and a second host of a condensed polycyclic compound including pyrrolidine, represented by any one among Formula 2-1 to Formula 2-5, in the emission layer EML, and may show a lower driving voltage, improved emission efficiency and long life characteristics when compared with a case using a single host among the first host and the second host.

Figure 4:
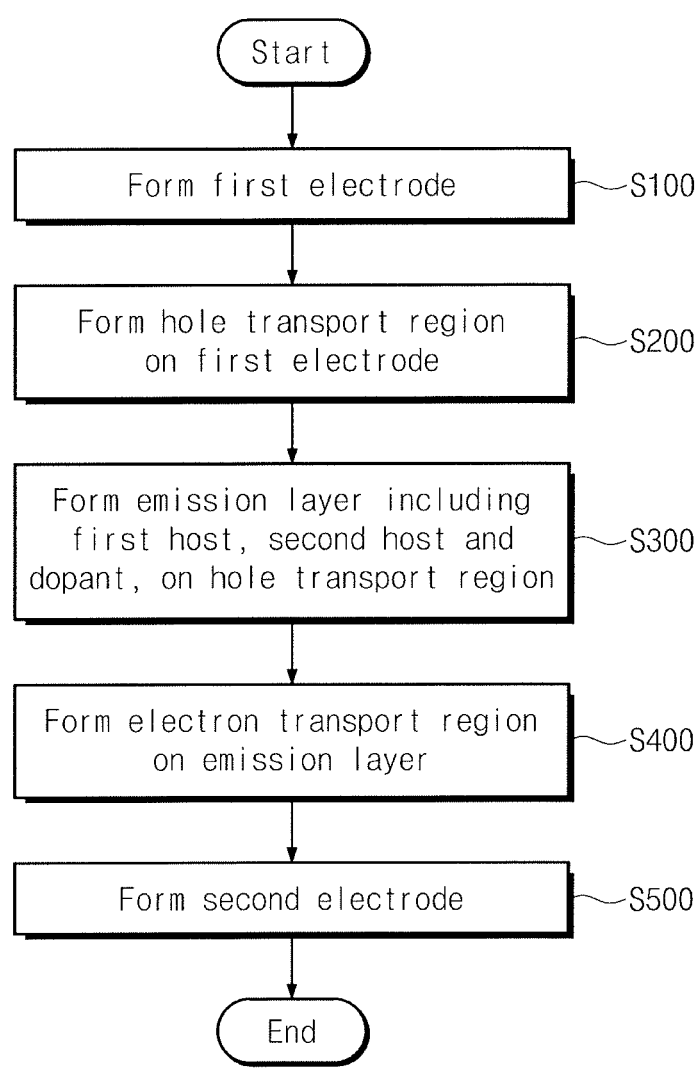
FIGS. 4 and 5 illustrate flowcharts showing methods of manufacturing organic electroluminescence devices of exemplary embodiments.
Figure 5:
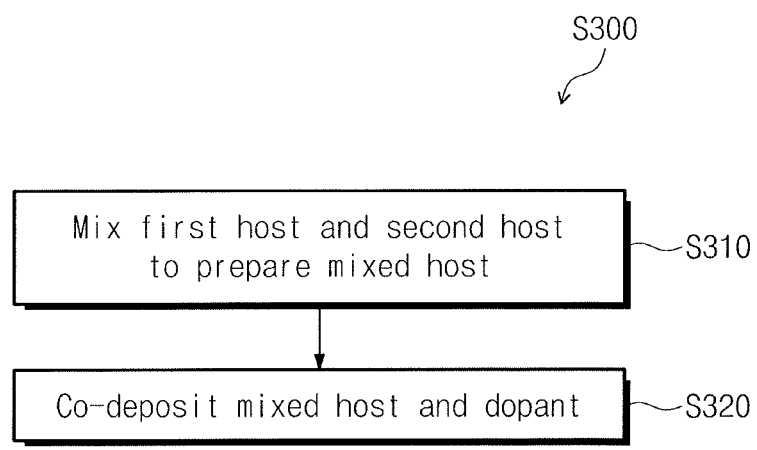

FIGS. 4 and 5 illustrate flowcharts showing methods of manufacturing organic electroluminescence devices according to exemplary embodiments. In the explanation on the method of manufacturing an organic electroluminescence device of an embodiment below, each organic layer of the organic electroluminescence device will not be explained in detail, and only manufacturing steps will be explained. The same explanation on the above-explained organic electroluminescence device of an embodiment will be applied to each organic layer of an organic electroluminescence device manufactured by the method of manufacturing an organic electroluminescence device of an embodiment.

Referring to FIG. 4, the method of manufacturing an organic electroluminescence device of an embodiment may include forming a first electrode (S100), forming a hole transport region on the first electrode (S200), forming an emission layer including a first host, a second host and a dopant, on the hole transport region (S300), forming an electron transport region on the emission layer (S400), and forming a second electrode (S500).

In an implementation, in forming an emission layer (S300), the emission layer may include a first host represented by the following Formula 1 and a second host represented by one of the following Formula 2-1 to Formula 2-5:

[Formula 1]

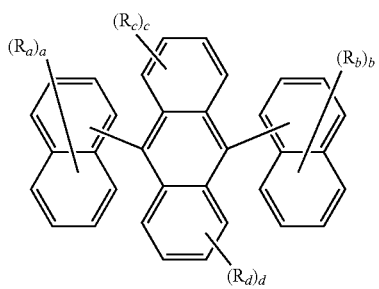

-continued

[Formula 2-1]

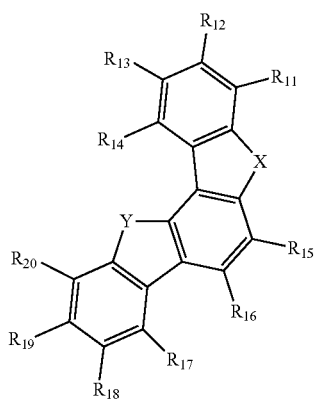

[Formula 2-2]

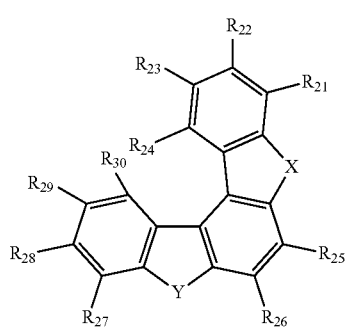

[Formula 2-3]

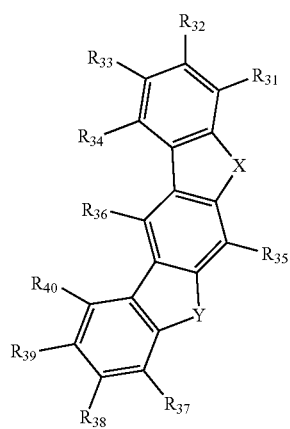

[Formula 2-4]

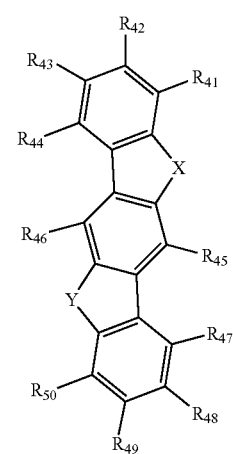

-continued

[Formula 2-5]

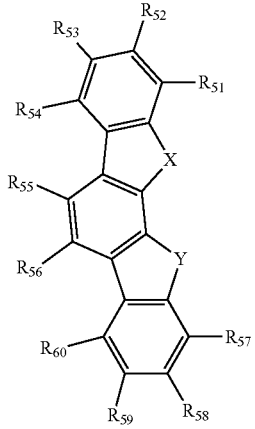

In Formula 1, $R_a$ to $R_d$ may each independently be, e.g., a hydrogen atom, a deuterium atom, a halogen atom, a substituted or unsubstituted silyl group, a substituted or unsubstituted germanium group, a substituted or unsubstituted alkyl group of 1 to 20 carbon atoms, a substituted or unsubstituted aryl group of 6 to 30 ring carbon atoms, or a substituted or unsubstituted heteroaryl group of 2 to 30 ring carbon atoms, "a" and "b" may each independently be, e.g., an integer of 0 to 7, and "c" and "d" may each independently be, e.g., an integer of 0 to 4.

In Formula 2-1 to Formula 2-5, X and Y may each independently be, e.g., $NR_1$, $CR_2R_3$, or $SiR_4R_5$. In an implementation, one of X and Y is $NR_1$, and the remainder or other is $CR_2R_3$ or $SiR_4R_5$. $R_1$ to $R_5$ and $R_{11}$ to $R_{60}$ may each independently be, e.g., a hydrogen atom, a deuterium atom, a halogen atom, a substituted or unsubstituted silyl group, a substituted or unsubstituted alkyl group of 1 to 20 carbon atoms, a substituted or unsubstituted hydrocarbon ring of 6 to 30 ring carbon atoms, or a substituted or unsubstituted heterocycle of 2 to 30 ring carbon atoms.

The same explanation referring to the above-explained organic electroluminescence device of an embodiment may be applied to the first host and the second host included in the emission layer.

In the method of manufacturing an organic electroluminescence device of an embodiment, the emission layer may include a dopant together with the first host and the second host, and in this case, the dopant may be a phosphorescence dopant. For example, the dopant may be a green phosphorescence dopant.

In an implementation, in forming an emission layer (S300), the dopant may include one of the following D1 to D3.

D1

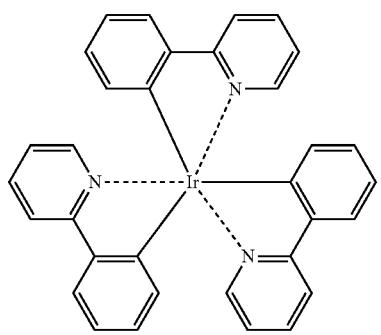

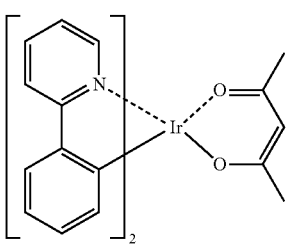

D2

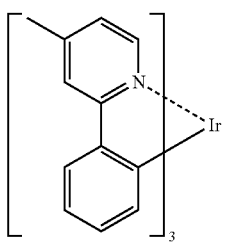

D3

Each of the metal layers and organic layer such as the first electrode EL1, the second electrode EL2, the hole transport region HTR, the emission layer EML and the electron transport region ETR of the organic electroluminescence device 10 explained referring to FIGS. 1 to 3, may be provided using a deposition process.

For example, in the method of manufacturing an organic electroluminescence device of an embodiment, which is explained referring to FIG. 4, forming the first electrode (S100), forming the hole transport region on the first electrode (S200), forming the emission layer including the first host, the second host and the dopant, on the hole transport region (S300), forming the electron transport region on the emission layer (S400), and forming the second electrode (S500), may be carried out using a deposition process.

In an implementation, referring to FIG. 5, in the method of manufacturing an organic electroluminescence device of an embodiment, forming an emission layer (S300) may include mixing a first host and a second host to prepare a mixed host (S310), and co-depositing the mixed host and a dopant (S320).

For example, in the method of manufacturing an organic electroluminescence device of an embodiment, forming the emission layer (S300) may be performed by mixing a first host and a second host in advance, before the deposition process to provide one source with a mixed host, and then co-depositing the mixed host supplied from one source with a dopant. In an implementation, in the mixed host, the first host and the second host may be included in a weight ratio of 50:40 to 80:10.

In an implementation, in the method of manufacturing an organic electroluminescence device of an embodiment, different from the explanation referring to FIG. 5, forming the emission layer (S300) may be performed by supplying the first host and the second host to different sources, respectively, and then co-depositing the first host, the second host, and the dopant, which are respectively supplied from different sources, in one step. In this case, the weight ratio of the first host and the second host supplied may be 50:40 to 80:10.

In the method of manufacturing an organic electroluminescence device of an embodiment, the first host and the second host with respect to the dopant may have a weight ratio of 59:41 to 95:5. For example, the weight ratio of the mixture host which includes the first host and the second host with respect to the dopant may be 59:41 to 95:5.

In the method of manufacturing an organic electroluminescence device of an embodiment, the first host represented by Formula 1, the second host represented by one of Formula 2-1 to Formula 2-5, and the dopant are included during forming the emission layer, and an organic electroluminescence device having a low driving voltage, high efficiency and long life characteristics, may be provided.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

1. Manufacture of Organic Electroluminescence Device

The organic electroluminescence devices of the Examples and the Comparative Examples were manufactured by a method described below.

On a glass substrate, ITO with a thickness of about 500 Å was patterned, washed with isopropyl alcohol and ultra-pure water, cleaned with ultrasonic waves, exposed to UV for about 30 minutes, and treated with ozone. Then, 2-TNATA was deposited to a thickness of about 600 Å to form a hole injection layer, and NBP was deposited to a thickness of about 300 Å to form a hole transport layer.

On the hole transport layer, a host and a dopant were co-deposited to form an emission layer with a thickness of about 400 Å. By changing the host used in the emission layer, organic electroluminescence devices of Example 1 to Example 8, and Comparative Example 1 to Comparative Example 6 were manufactured. In the emission layers of Example 1 to Example 8, and Comparative Example 1 to Comparative Example 6, a green phosphorescence dopant, D1, was used as the dopant, and the host and the dopant were co-deposited in the weight ratio of 90:10.

In Example 1 to Example 8, both a first host represented by Formula 1 and a second host represented by any one among Formula 2-1 to Formula 2-5 were included. In Comparative Example 1 and Comparative Example 2, only the first host was used, in Comparative Example 3 and Comparative Example 4, only the second host was used, and in Comparative Example 5 and Comparative Example 6, two host materials were used but the combination of the hosts was different from those used in the Examples.

The combination of the host materials used in the Examples and the Comparative Examples are listed in Table 1 below.

TABLE 1

| Device manufacturing example | First host | Second host |
|---|---|---|
| Example 1 | H1-3 | H2-A |
| Example 2 | H1-3 | H2-A |
| Example 3 | H1-3 | H2-A |
| Example 4 | H1-3 | H2-A |
| Example 5 | H1-8 | H2-B |
| Example 6 | H1-8 | H2-B |
| Example 7 | H1-8 | H2-B |
| Example 8 | H1-8 | H2-B |
| Comparative Example 1 | H1-3 | — |

TABLE 1-continued

| Device manufacturing example | First host | Second host |
|---|---|---|
| Comparative Example 2 | H1-8 | — |
| Comparative Example 3 | — | H2-A |
| Comparative Example 4 | — | H2-B |
| Comparative Example 5 | C1-1 | H2-A |
| Comparative Example 6 | H1-3 | C2-2 |

Dopant D1 used in the Examples and the Comparative Examples is shown below.

D1
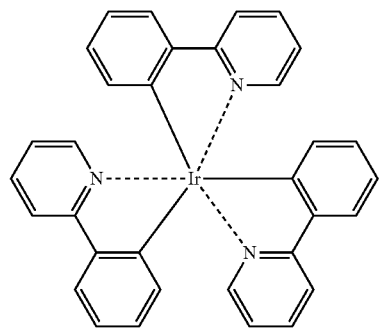

In addition, the first host and the second host compounds used in the Examples and the Comparative Examples are shown below.

H1-3
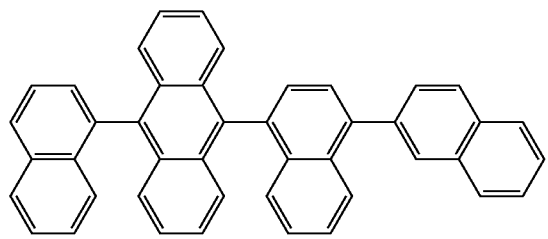

H1-8
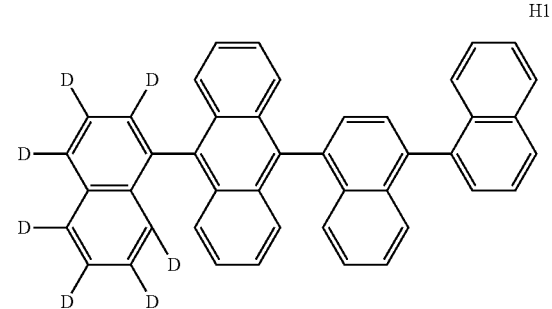

H2-A
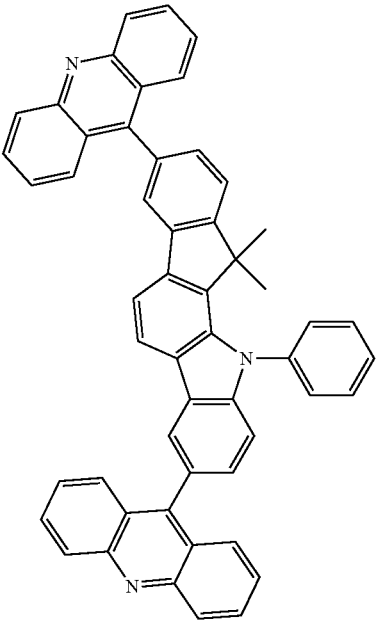

H2-B
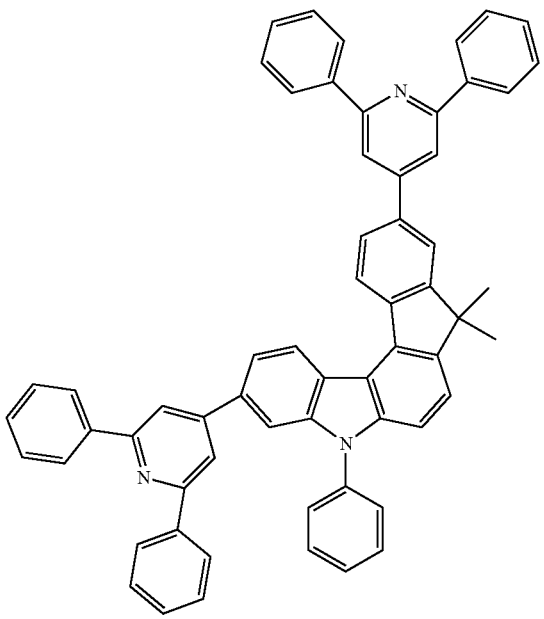

C1-1
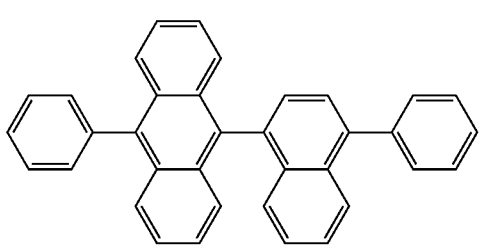

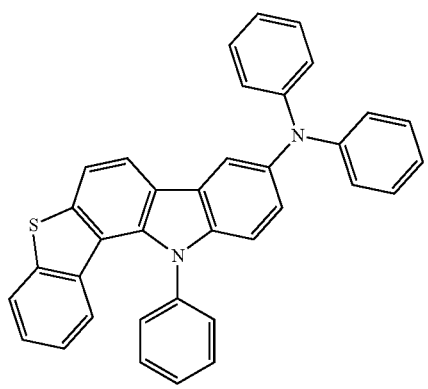

C2-2

On the emission layer (formed using each host combination of Example 1 to Example 8 and Comparative Example 1 to Comparative Example 6 as shown in Table 1) Alq$_3$ was deposited to a thickness of about 300 Å to form an electron transport layer. Then, a second electrode was formed using aluminum (Al) to a thickness of about 1,200 Å.

The materials of the hole injection layer and the hole transport layer used for the manufacture of the organic electroluminescence devices of the Examples and the Comparative Examples are shown below.

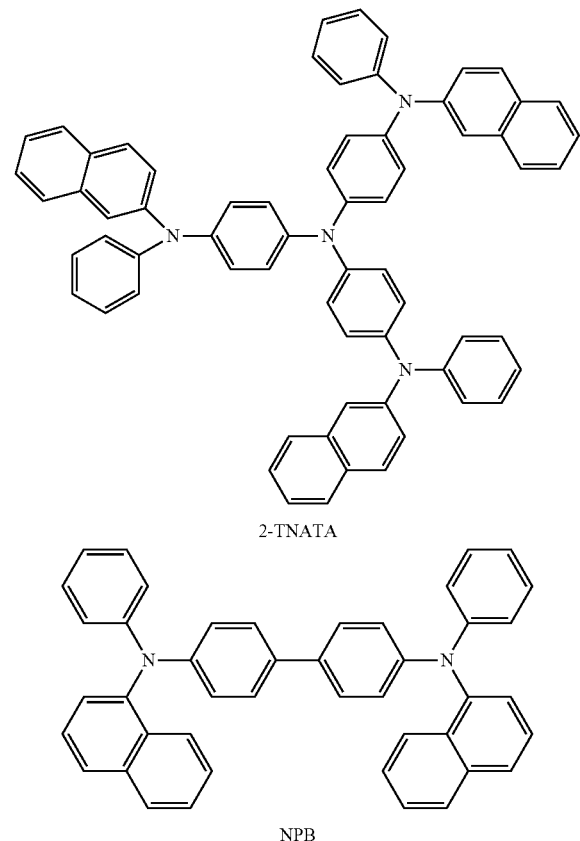

2-TNATA

NPB

2. Evaluation of the Properties of Organic Electroluminescence Device

In Table 2, the evaluation results of the organic electroluminescence devices of Example 1 to Example 8 and Comparative Example 1 to Comparative Example 6 are shown. In Table 2, emission efficiency at a current density of 8 mA/cm$^2$, and life (T$_{90}$) corresponding to time required for decreasing luminance to 90% degree from luminance 9,000 nit standard, for the organic electroluminescence devices thus manufactured, are shown.

TABLE 2

| Device manufacturing example | Emission layer configuration (first host:second host:dopant) | Current density (mA/cm$^2$) | Efficiency (cd/A) | Life (T$_{90}$) (hrs) |
| --- | --- | --- | --- | --- |
| Example 1 | 75:15:10 | 8 | 42.1 | 110 |
| Example 2 | 65:25:10 | 8 | 44.1 | 88 |
| Example 3 | 70:20:10 | 8 | 30.2 | 96 |
| Example 4 | 60:30:10 | 8 | 22.5 | 110 |
| Example 5 | 75:15:10 | 8 | 28.6 | 68 |
| Example 6 | 65:25:10 | 8 | 37.2 | 113 |
| Example 7 | 70:20:10 | 8 | 32.4 | 76 |
| Example 8 | 60:30:10 | 8 | 39.5 | 87 |
| Comparative Example 1 | 90:0:10 | 8 | 13.4 | 23 |
| Comparative Example 2 | 90:0:10 | 8 | 8.9 | 32 |
| Comparative Example 3 | 0:90:10 | 8 | 14.3 | 58 |
| Comparative Example 4 | 0:90:10 | 8 | 14.7 | 52 |
| Comparative Example 5 | 75:15:10 | 8 | 13.4 | 65 |
| Comparative Example 6 | 75:15:10 | 8 | 17.2 | 73 |

Referring to the results of Table 2, the efficiency and life characteristics of Example 1 to Example 8, which included an emission layer including both the first host represented by Formula 1 and the second host represented by any one among Formula 2-1 to Formula 2-5, were better than Comparative Example 1 to Comparative Example 4, which used a single host. In addition, the emission efficiency of the organic electroluminescence devices of Example 1 to Example 8 were better than Comparative Example 5 and Comparative Example 6, which used two hosts but different host combinations from the Examples.

Referring to the results of Example 1 to Example 8, and Comparative Example 1 to Comparative Example 4, the organic electroluminescence device of the Examples included the first host and the second host together in the emission layer, and defects of one host were compensated by another host to show synergistic effects. Thus, better emission efficiency and life characteristics were achieved at the same time when compared with a case including a single host.

In an organic electroluminescence device of an embodiment and a method of manufacturing an organic electroluminescence device of an embodiment for manufacturing the same, an emission layer may include a first host and a second host, having different properties, together as the materials of the emission layer, and the first host and the second host may form an exciplex. For example, the first host and the second host may form an exciplex in the organic electroluminescence device of an embodiment, and holes and electrons may be easily injected into the emission layer. Thus, a driving voltage may decrease, charge balance may increase, and the recombination probability of holes and electrons in the emission layer may increase, thereby showing increased emission efficiency. In addition, through the recombination of holes and electrons in the emission layer, sufficient light emission may be achieved, deterioration at the interface of the emission layer with another organic layer may be moderated, and thus, device life may increase.

In addition, in the method of manufacturing an organic electroluminescence device of an embodiment, a first host and a second host may be co-deposited with a dopant to form an emission layer, and thus, the first host and the second host may be uniformly distributed in the emission layer. Accordingly, light emission quality from the whole emission layer may be uniform.

Referring to the results of Example 1 to Example 8 and Comparative Example 5 or Comparative Example 6 as in Table 2, a case where using the combination of a first host material represented by Formula 1 and a second host material represented by any one among Formula 2-1 to Formula 2-5 as in the Examples showed improved light emission efficiency properties when compared with a case using the combination of another two host materials.

The organic electroluminescence device of an embodiment may include two different host materials in an emission layer, and may show improved device properties including a low driving voltage, long life and high efficiency.

According to the method of manufacturing an organic electroluminescence device of an embodiment, an emission layer may be formed to include two different host materials, and thus, improved device properties may be achieved.

One or more embodiments may provide an organic electroluminescence device having improved emission efficiency and device life.

One or more embodiments may provide a method of manufacturing an organic electroluminescence device having improved emission efficiency and device life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescence device, comprising:
a first electrode;
a second electrode on the first electrode; and
an emission layer between the first electrode and the second electrode,
wherein the emission layer comprises:
a first host represented by the following Formula 1, and
a second host represented by one of the following Formula 2-1 to Formula 2-5:

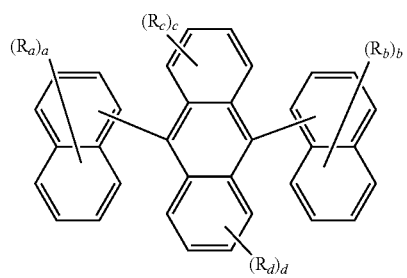

Formula 1

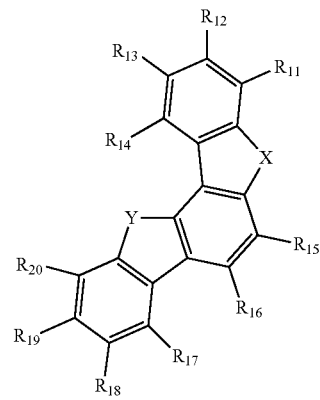

Formula 2-1

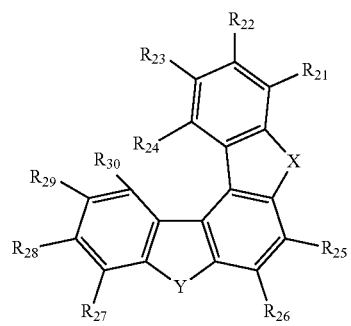

Formula 2-2

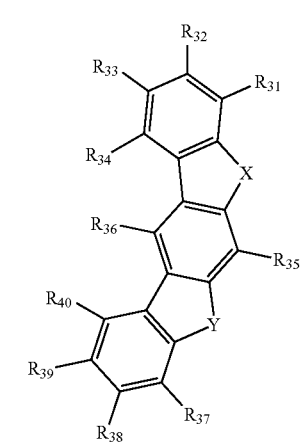

Formula 2-3

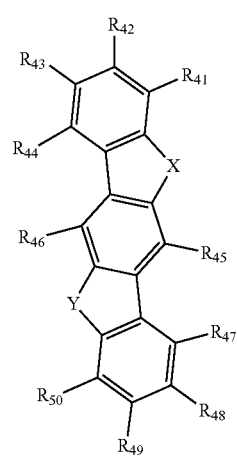

Formula 2-4

-continued

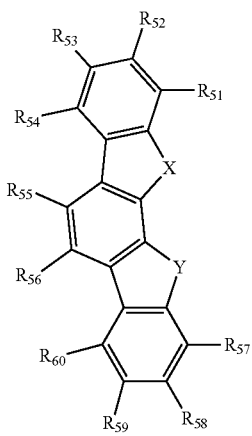

Formula 2-5 in Formula 1,
$R_a$ to $R_d$ are each independently a hydrogen atom, a deuterium atom, a halogen atom, a substituted or unsubstituted silyl group, a substituted or unsubstituted germanium group, a substituted or unsubstituted alkyl group of 1 to 20 carbon atoms, a substituted or unsubstituted aryl group of 6 to 30 ring carbon atoms, or a substituted or unsubstituted heteroaryl group of 2 to 30 ring carbon atoms,
"a" and "b" are each independently an integer of 0 to 7, and
"c" and "d" are each independently an integer of 0 to 4,
in Formula 2-1 to Formula 2-5,
X and Y are each independently $NR_1$, $CR_2R_3$, or $SiR_4R_5$, provided that one of X and Y is $NR_1$,
$R_1$ to $R_5$ and $R_{11}$ to $R_{60}$ are each independently a hydrogen atom, a deuterium atom, a halogen atom, a substituted or unsubstituted silyl group, a substituted or unsubstituted alkyl group of 1 to 20 carbon atoms, a substituted or unsubstituted hydrocarbon ring of 6 to 30 ring carbon atoms, or a substituted or unsubstituted heterocycle of 2 to 30 ring carbon atoms.

2. The organic electroluminescence device of claim 1, wherein an amount of the first host is larger than an amount of the second host in the emission layer.

3. The organic electroluminescence device of claim 1, wherein a weight ratio of the first host to the second host is 50:40 to 80:10.

4. The organic electroluminescence device of claim 1, wherein the first host and the second host form an exciplex.

5. The organic electroluminescence device of claim 1, wherein the compound represented by Formula 1 is represented by the following Formula 1-1 or Formula 1-2:

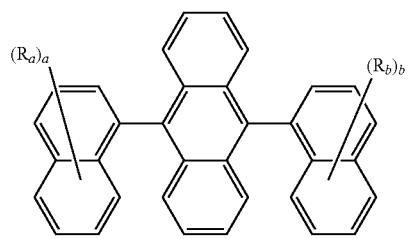

Formula 1-1

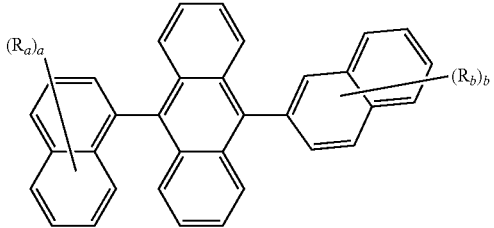

Formula 1-2 wherein, in Formula 1-1 and Formula 1-2, $R_a$, $R_b$, "a", and "b" are defined the same as those of Formula 1.

6. The organic electroluminescence device of claim 1, wherein the first host is a compound of the following Compound Group 1:

Compound Group 1

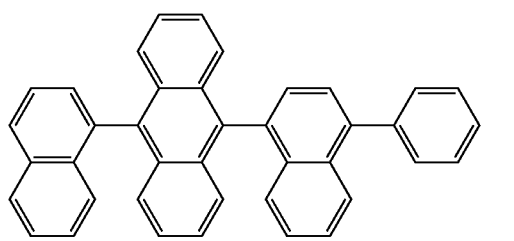

H1-1

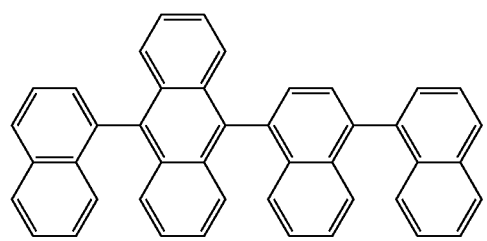

H1-2

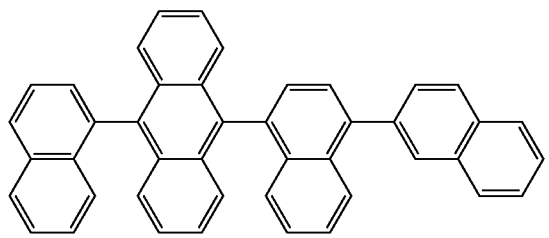

H1-3

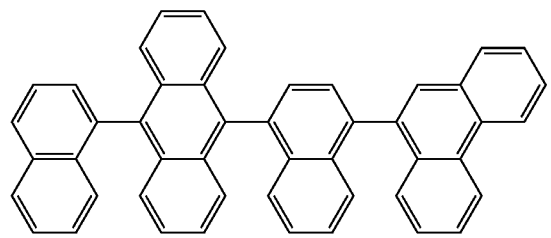

H1-4

-continued
H1-5
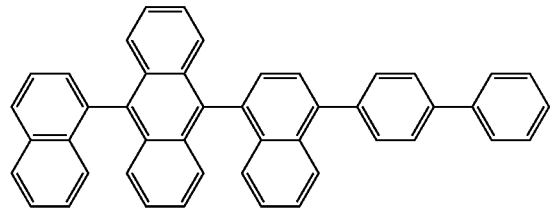
H1-6
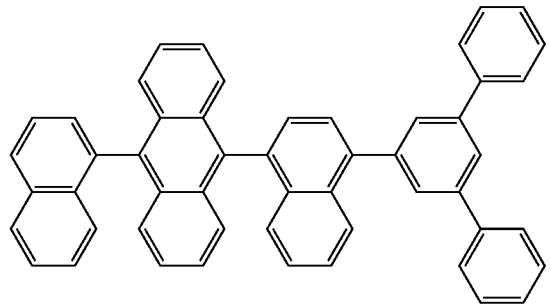
H1-7
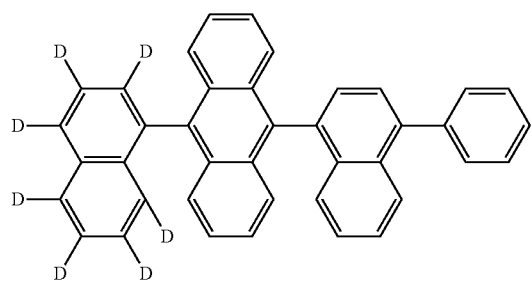
H1-8
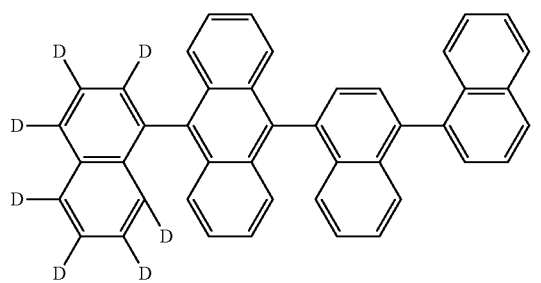
H1-9
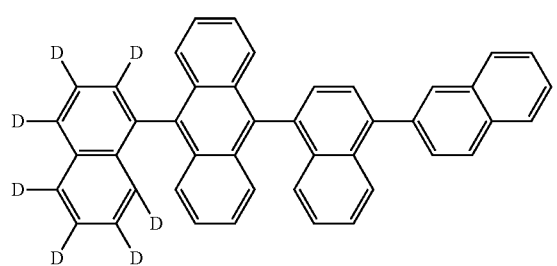
H1-10
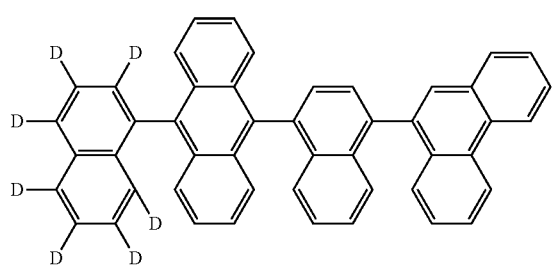
H1-11
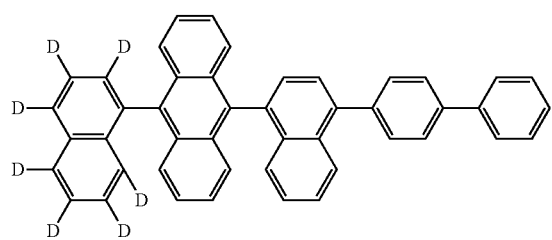
H1-12
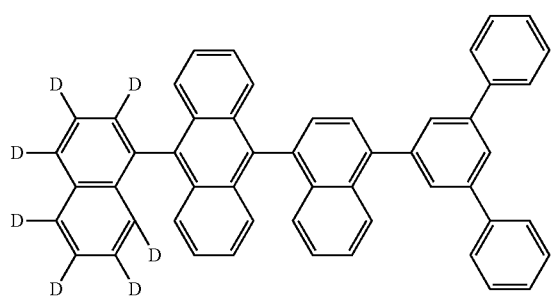
H1-13
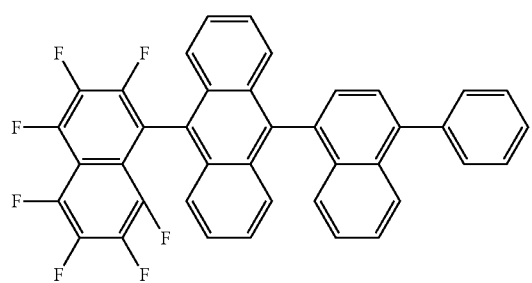
H1-14
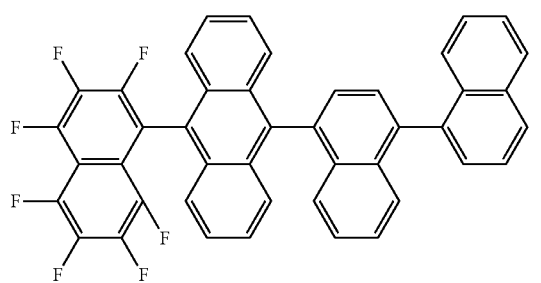

-continued
H1-15
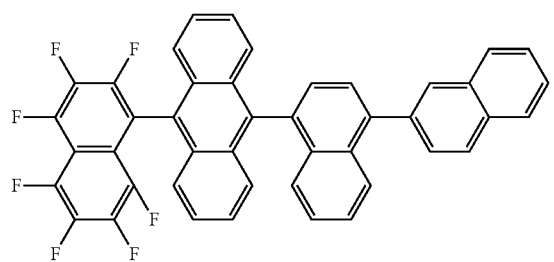
H1-16
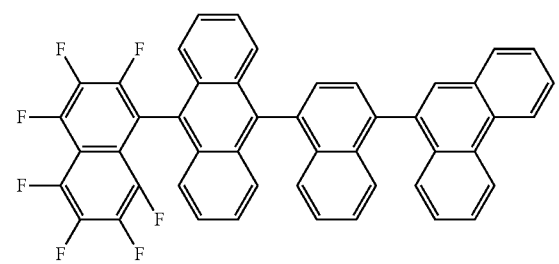
H1-17
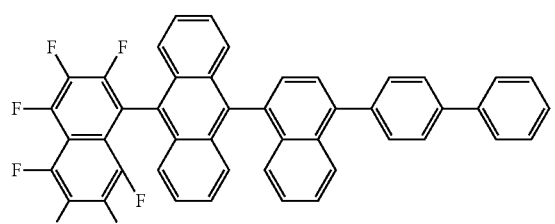
H1-18
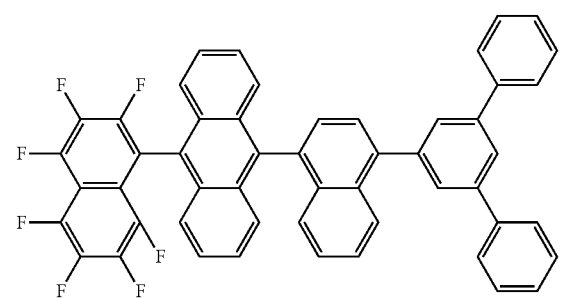
H1-19
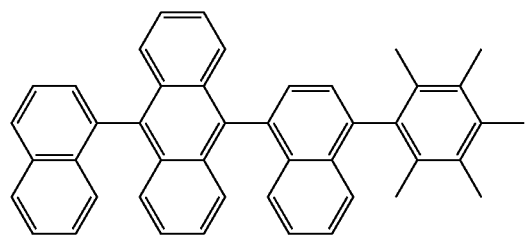
H1-20
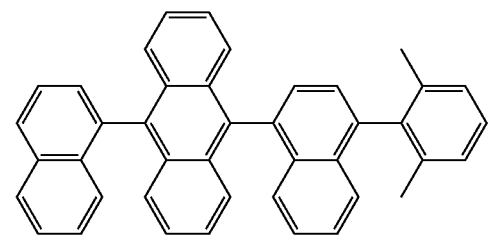
H1-21
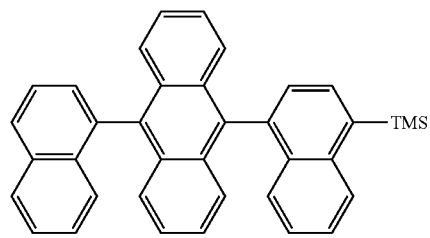
H1-22
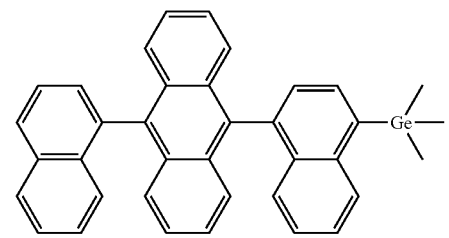
H1-23
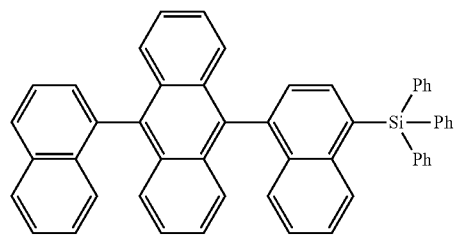
H1-24
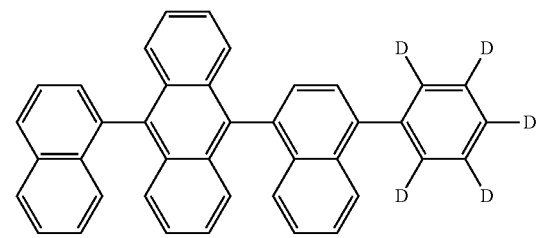

-continued
H1-25
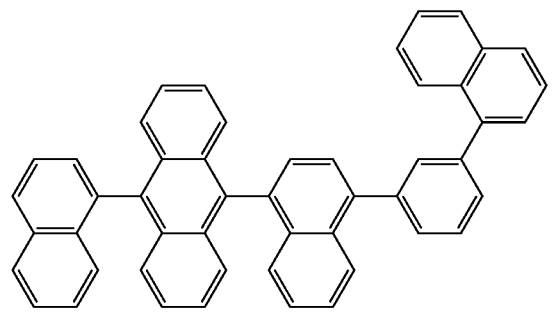
H1-26
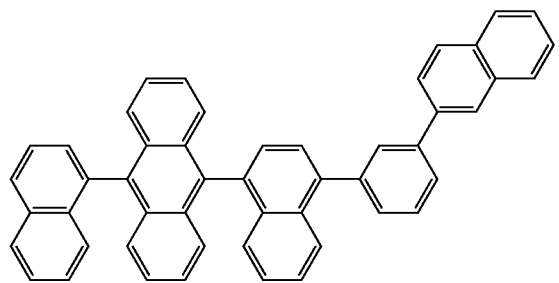
H1-27
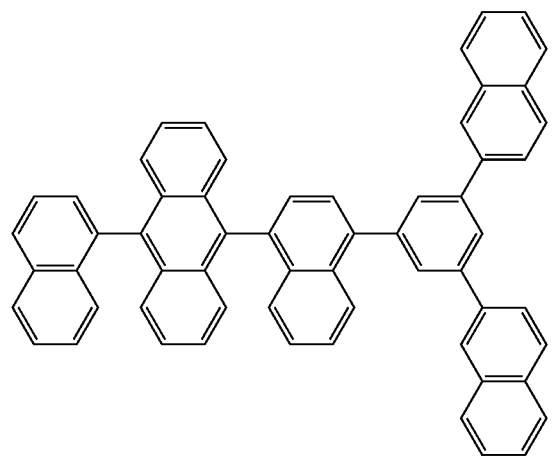
H1-28
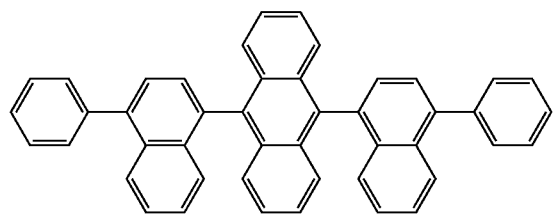
H1-29
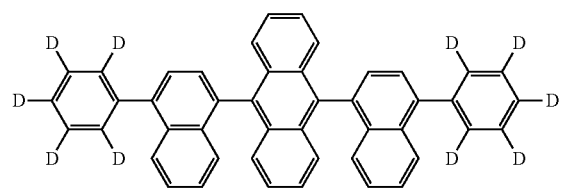
H1-30
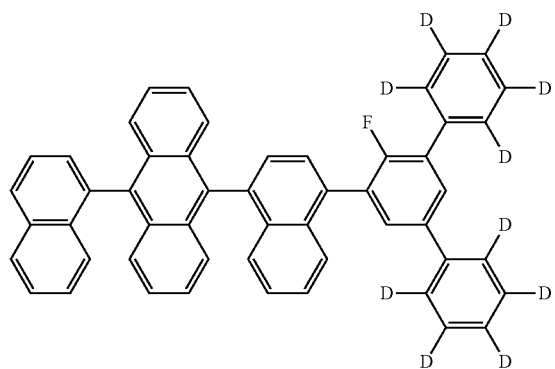
H1-31
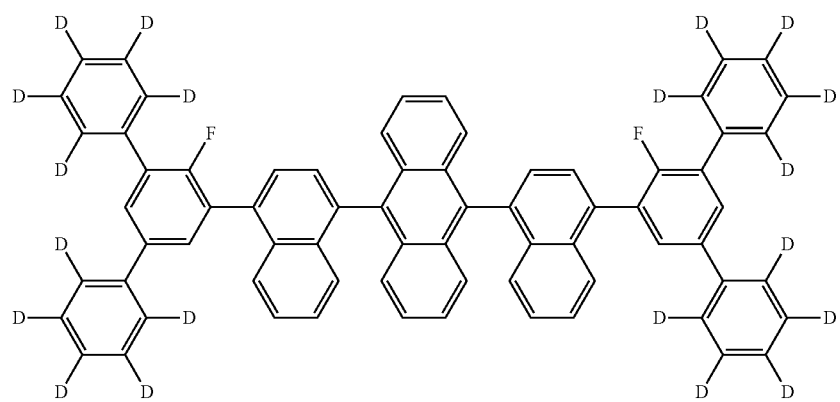

-continued
H1-32
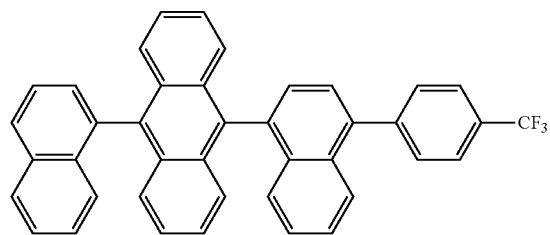
H1-33
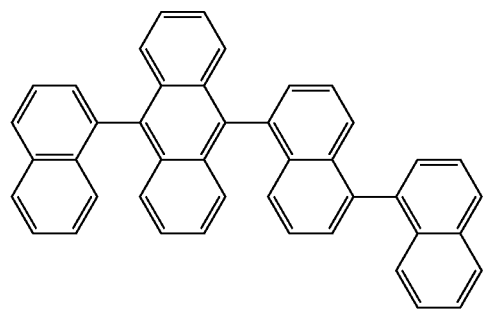
H1-34
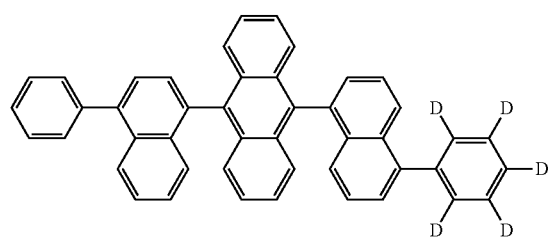
H1-35
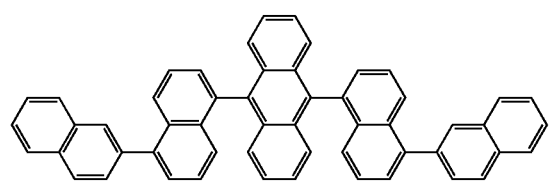
H1-36
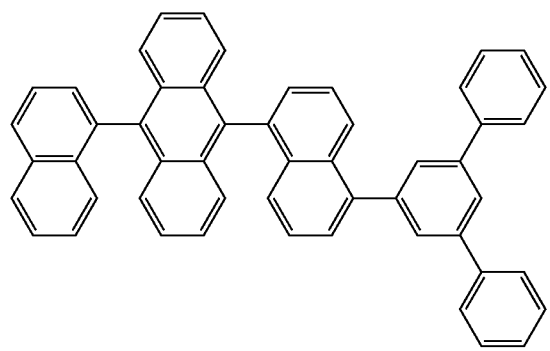
H1-37
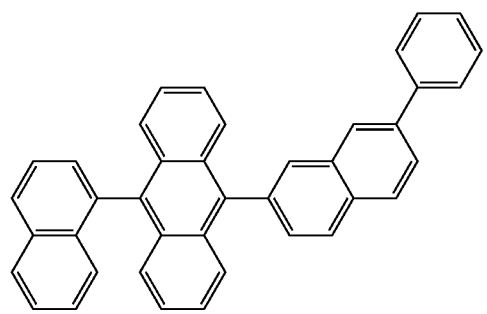
H1-38
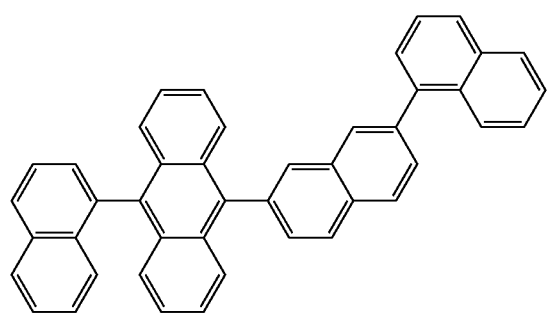
H1-39
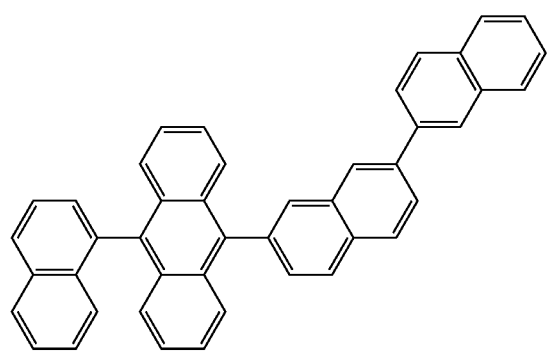

H1-40
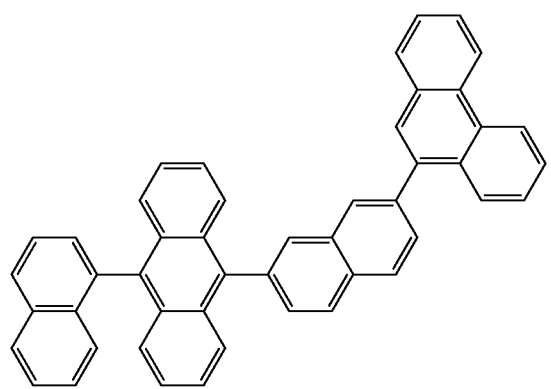
H1-41
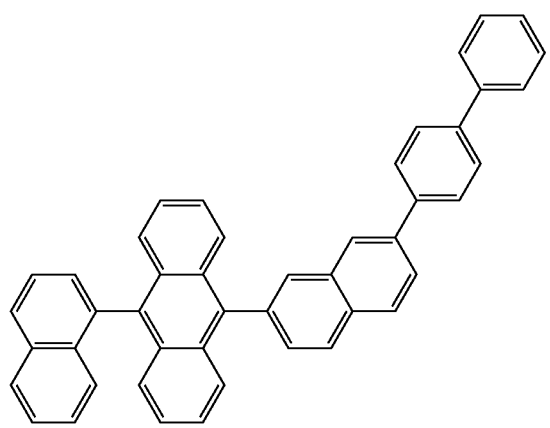
H1-42
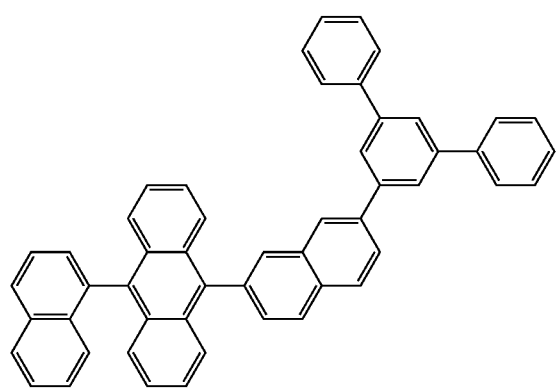
H1-43
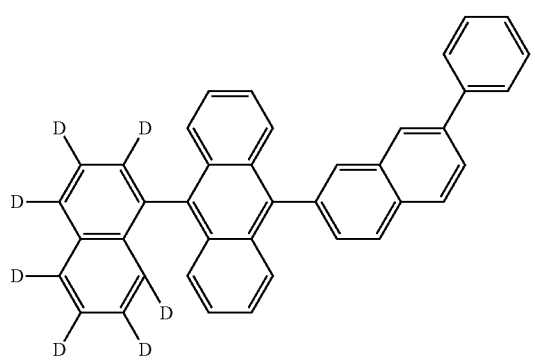
H1-44
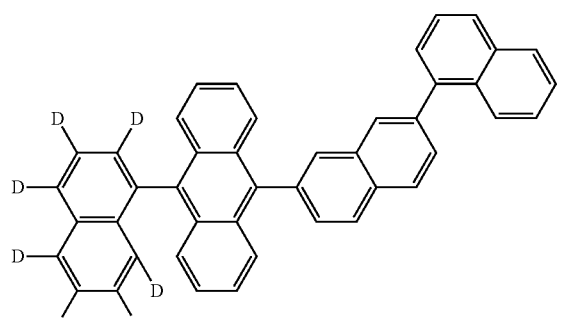
H1-45
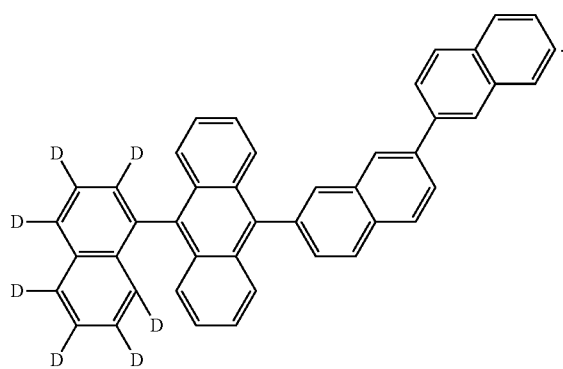

7. The organic electroluminescence device of claim 1, wherein the second host is represented by one of Formula 2-1 to Formula 2-5 is represented by one of the following Formula H2-1 to Formula H2-12:
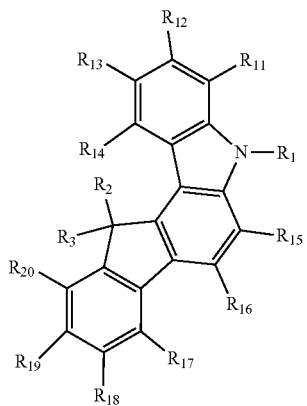
H2-1
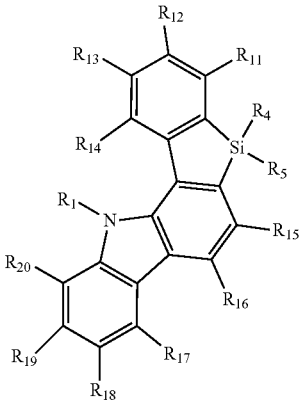
H2-2
H2-3
-continued
H2-4
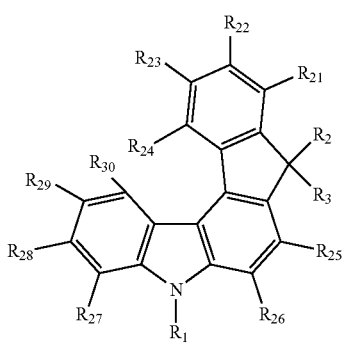
H2-5
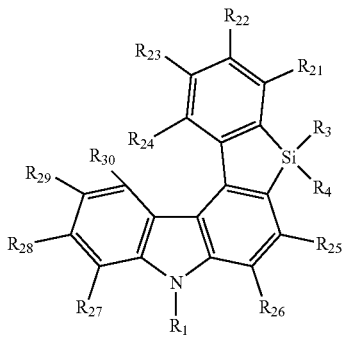
H2-6
H2-7
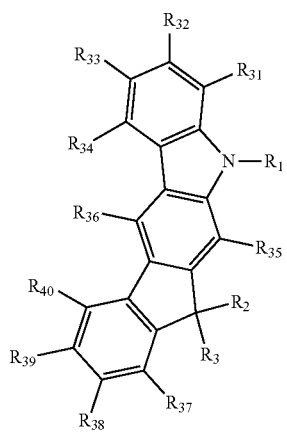

-continued
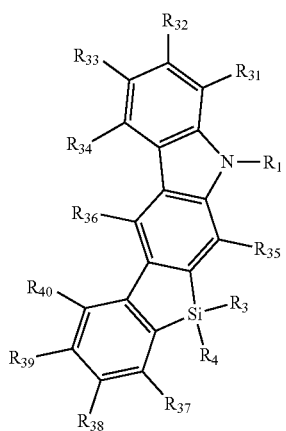
H2-8
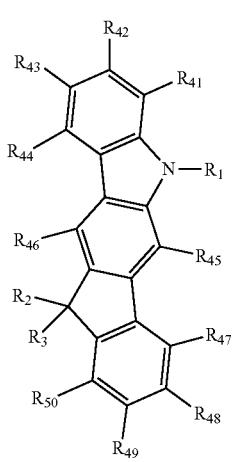
H2-9
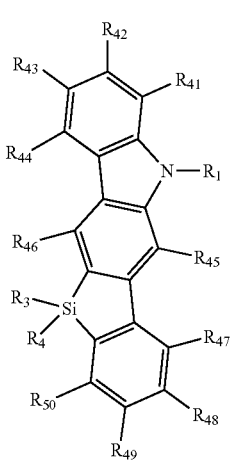
H2-10
-continued
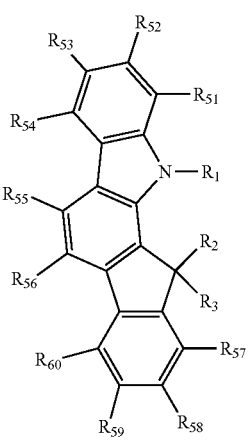
H2-11
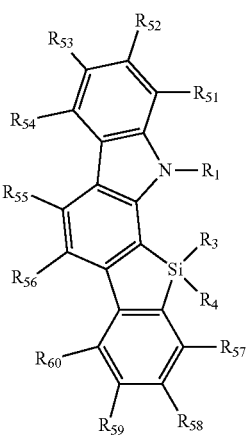
H2-12
wherein, in Formula H2-1 to Formula H2-12, $R_1$ to $R_5$ and $R_{11}$ to $R_{60}$ are defined the same as those of Formula 2-1 to Formula 2-5.
8. The organic electroluminescence device of claim 7, wherein at least one selected from the group consisting of $R_1$ to $R_5$ and $R_{11}$ to $R_{60}$ is a group represented by one of the following H1 to H110:
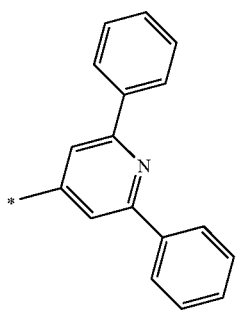
H1

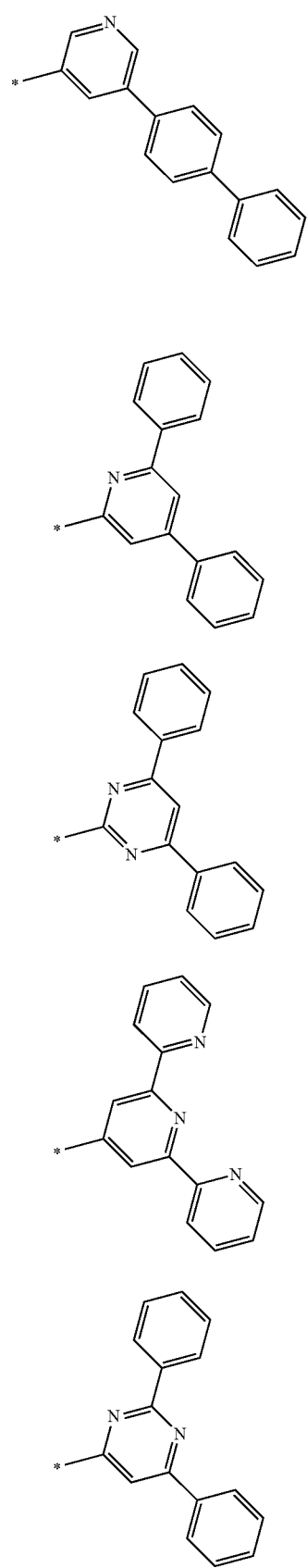
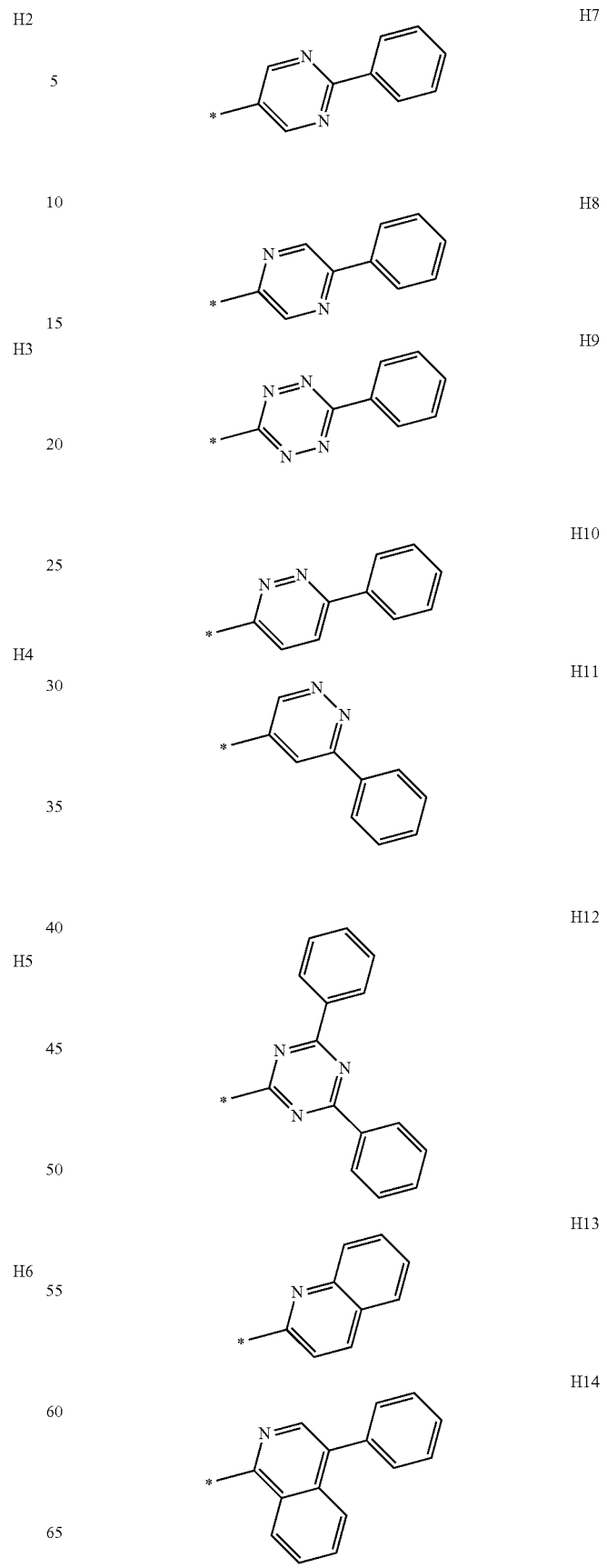

-continued
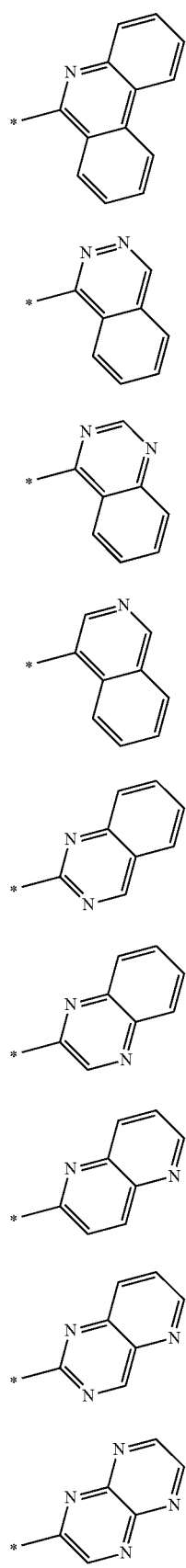
H15
H16
H17
H18
H19
H20
H21
H22
H23
-continued
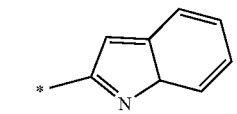 H24
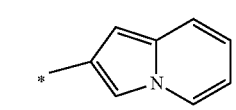 H25
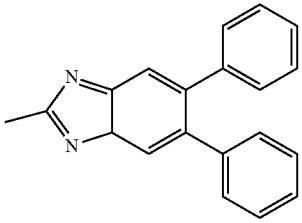 H26
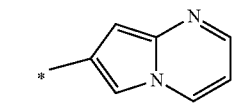 H27
H28
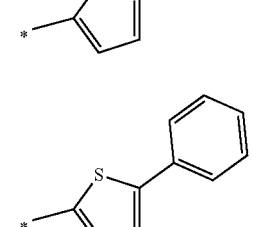 H29
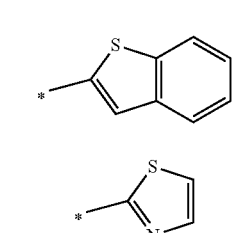 H30
H31
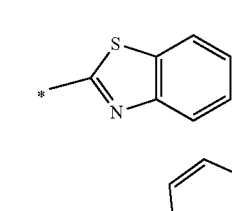 H32
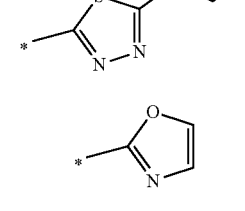 H33
H34

-continued
| | |
|---|---|
| 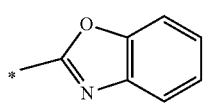 | H35 |
| 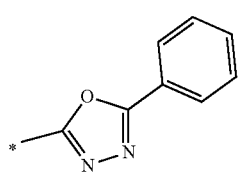 | H36 |
| 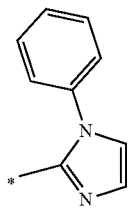 | H37 |
| 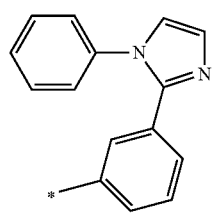 | H38 |
| 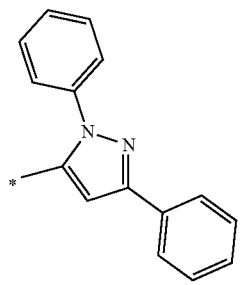 | H39 |
| 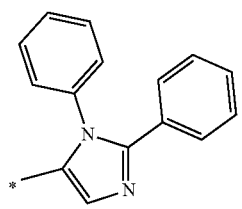 | H40 |
| 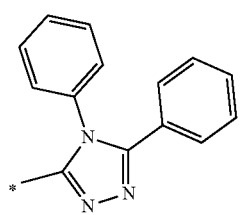 | H41 |
-continued
| | |
|---|---|
| 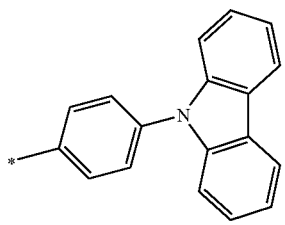 | H42 |
| 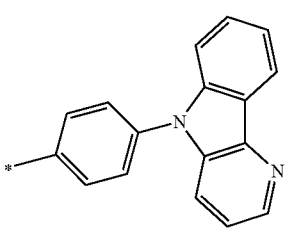 | H43 |
| 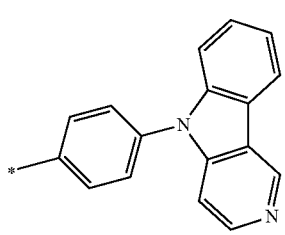 | H44 |
| 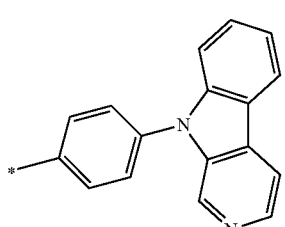 | H45 |
| 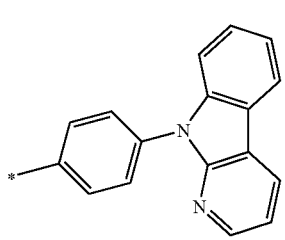 | H46 |
| 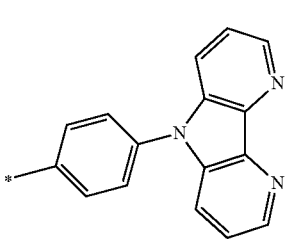 | H47 |
| 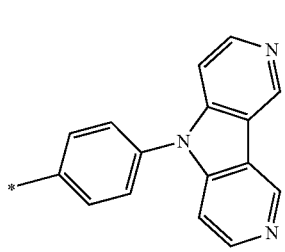 | H48 |

H49 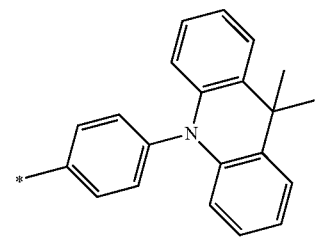
H50 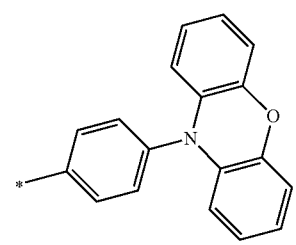
H51 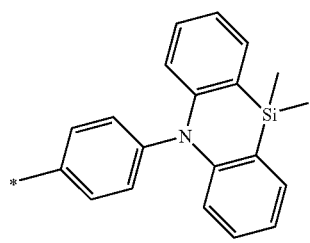
H52 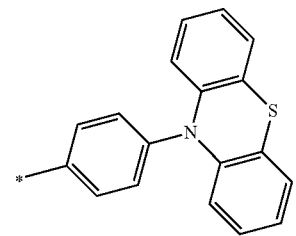
H53 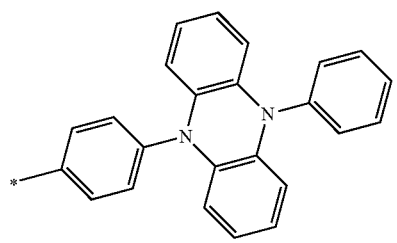
H54 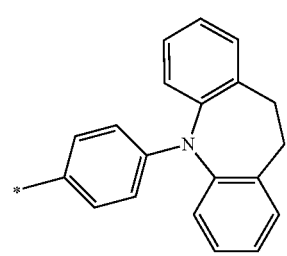
H55 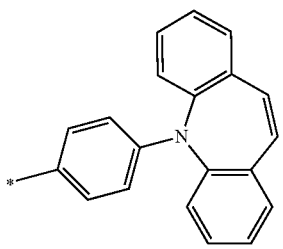
H56 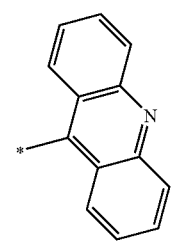
H57 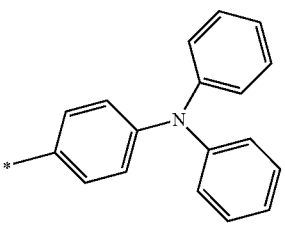
H58 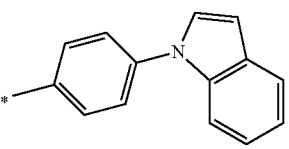
H59 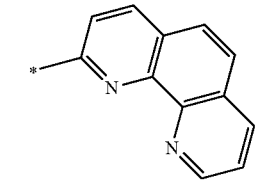
H60 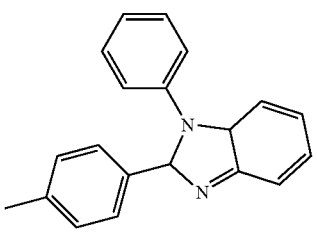
H61 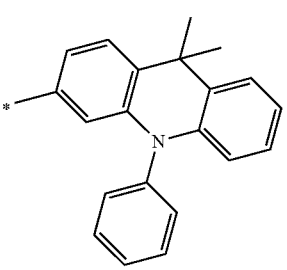

| | |
|---|---|
| H62 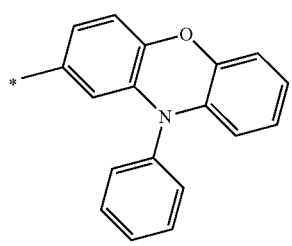 | H68 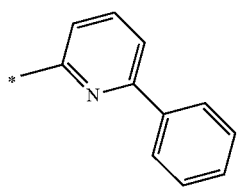 |
| H63 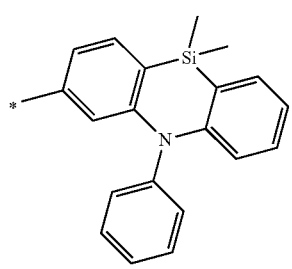 | H69 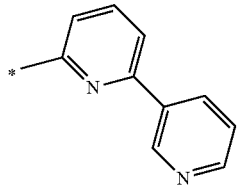 |
| H64 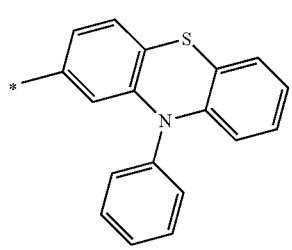 | H70 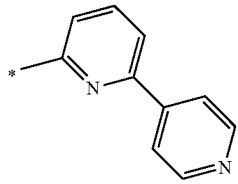 |
| | H71 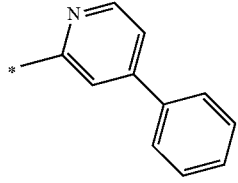 |
| H65 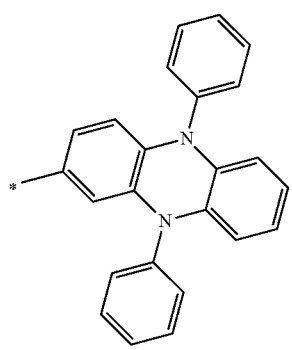 | H72 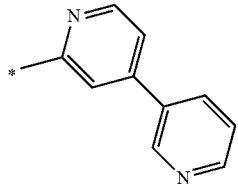 |
| | H73 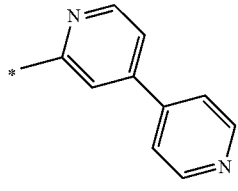 |
| H66 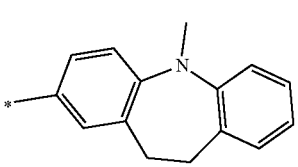 | H74 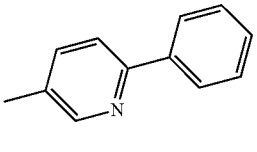 |
| H67 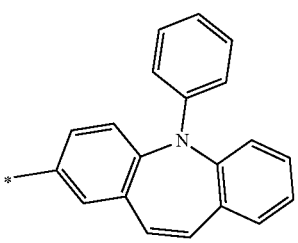 | H75 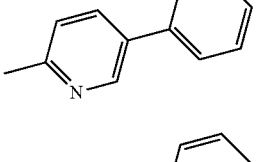 |
| | H76 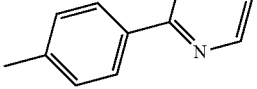 |

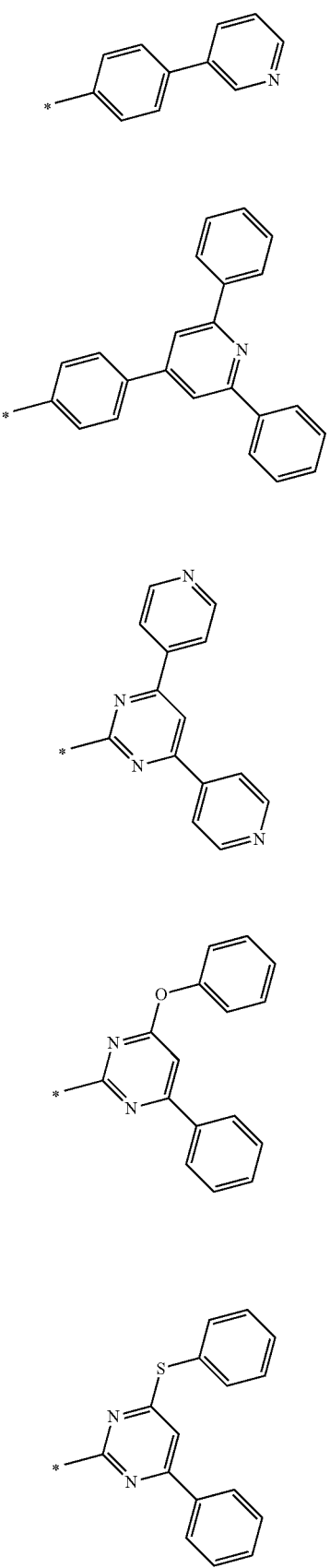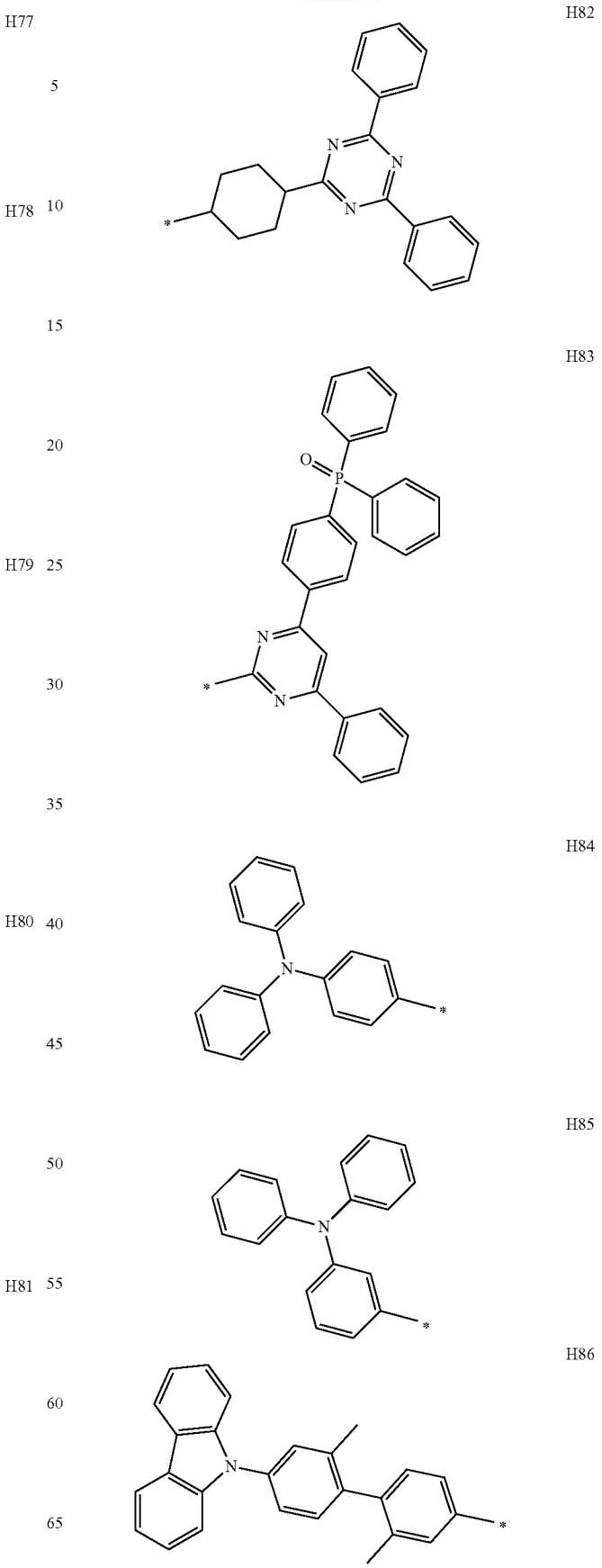

-continued
H87
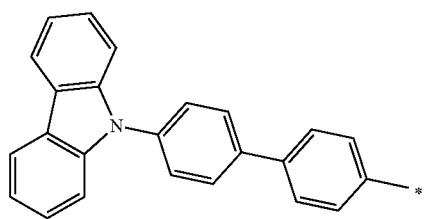
H88
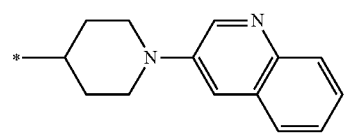
H89
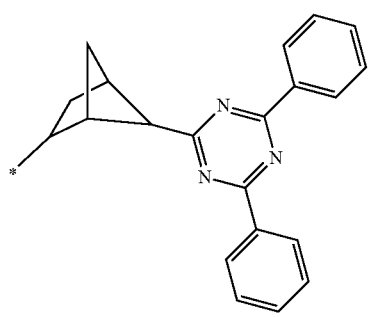
H90
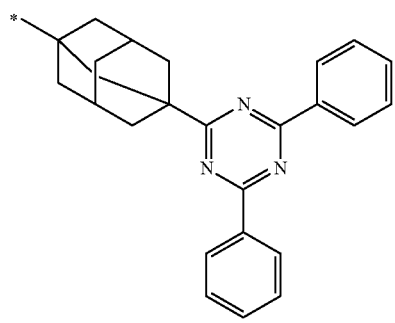
H91
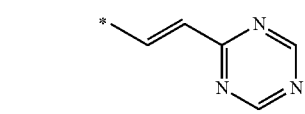
H92
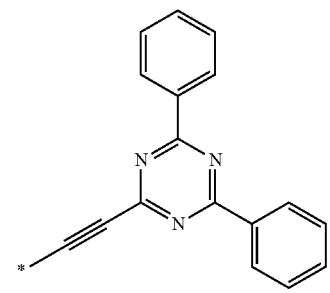
-continued
H93
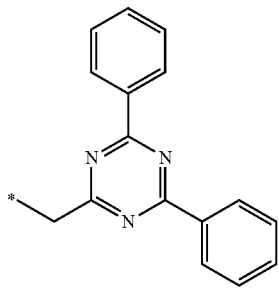
H94
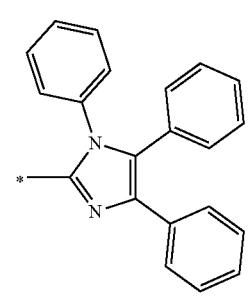
H95
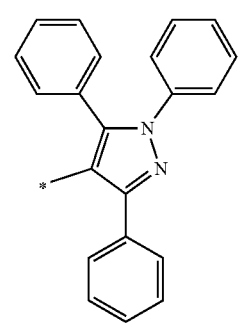
H96
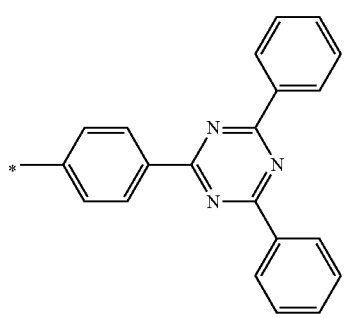
H97
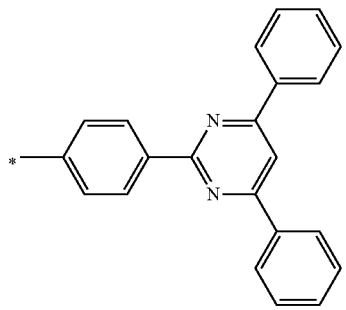

H98 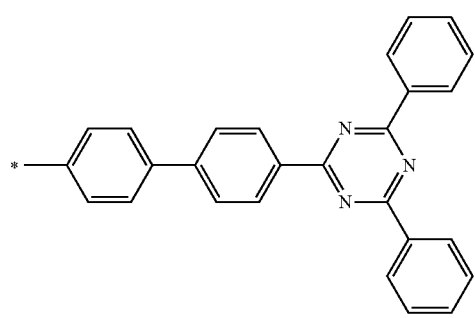
H99 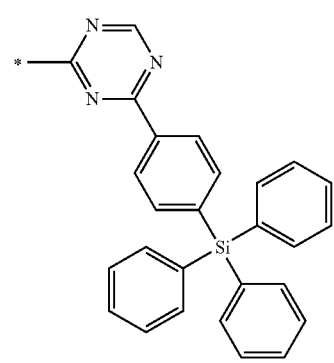
H100 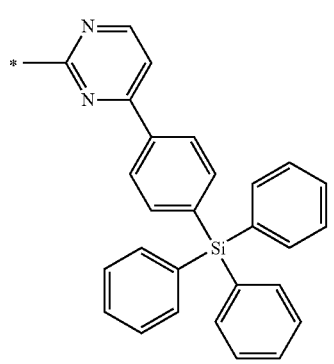
H101 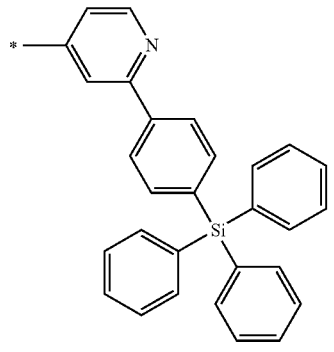
H102 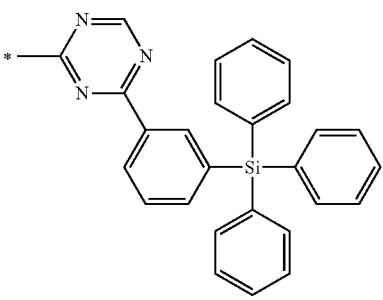
H103 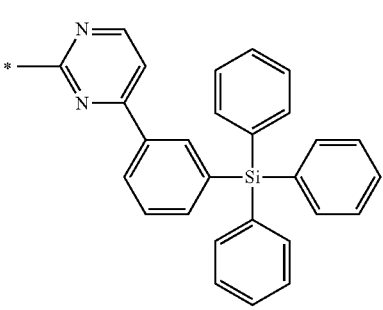
H104 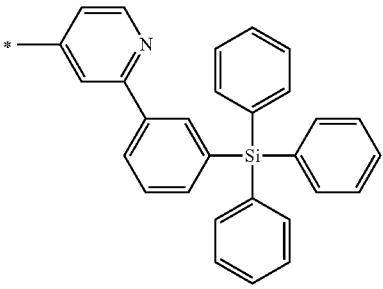
H105 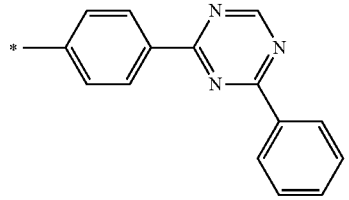
H106 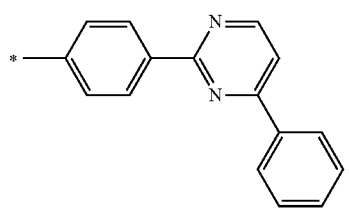
H107 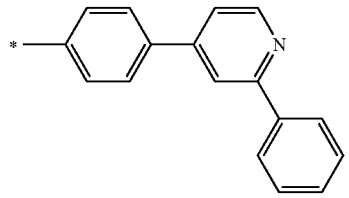

-continued

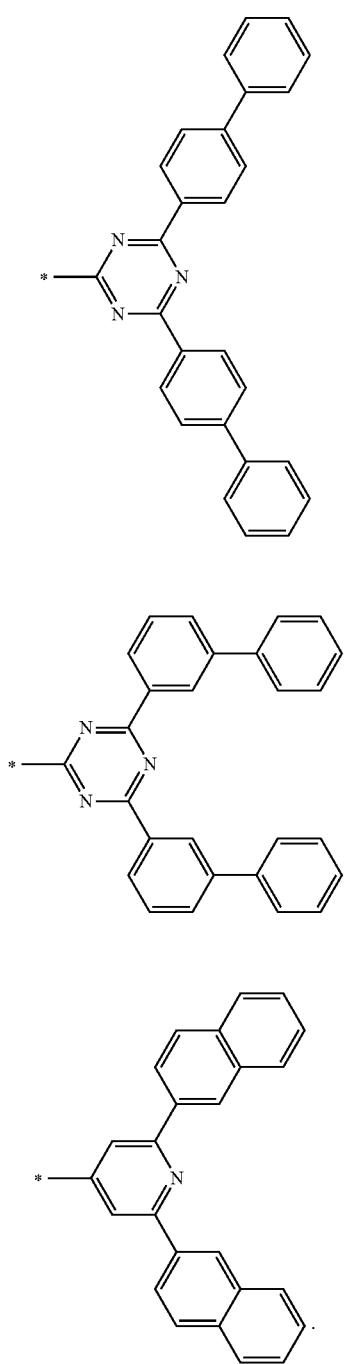

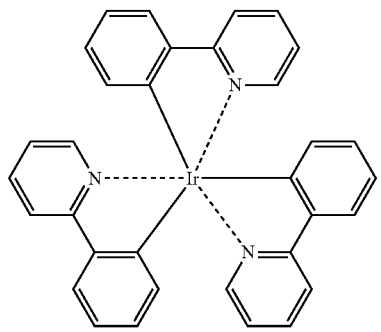

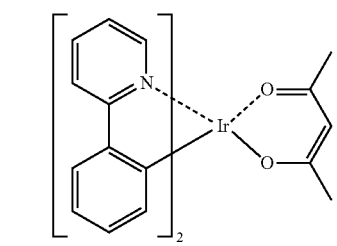

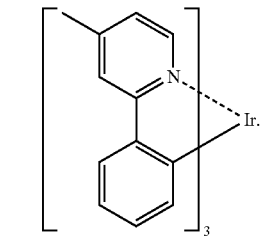

9. The organic electroluminescence device of claim 1, wherein:
the emission layer further comprises a dopant, and
a weight ratio of both the first host and the second host with respect to the dopant is 59:41 to 95:5.

10. The organic electroluminescence device of 9, wherein the dopant is a metal complex that comprises Ir, Os, Pt or Pd as a central atom.

11. The organic electroluminescence device of claim 1, wherein the emission layer further comprises a phosphorescence dopant represented by one of the following D1 to D3:

12. The organic electroluminescence device of claim 1, wherein the emission layer is configured to emit phosphorescence.

13. The organic electroluminescence device of claim 1, wherein the emission layer is configured to emit light in a green wavelength region.

14. An organic electroluminescence device, comprising:
a first electrode;
a hole transport region on the first electrode;
an emission layer on the hole transport region, the emission layer comprising a first host represented by the following Formula 1, a second host represented by one of the following Formula 2-1 to Formula 2-5, and a phosphorescence dopant;
an electron transport region on the emission layer; and
a second electrode on the electron transport region,

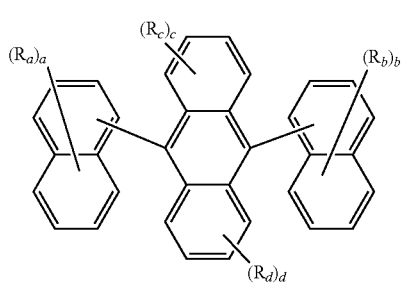

Formula 1

Formula 2-1

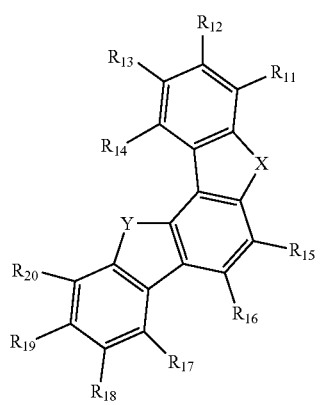

Formula 2-2

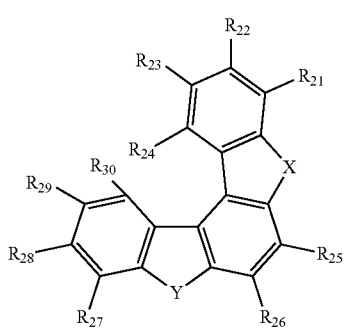

Formula 2-3

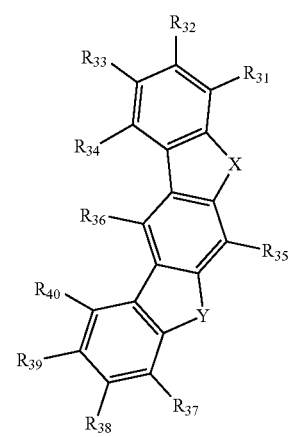

Formula 2-4

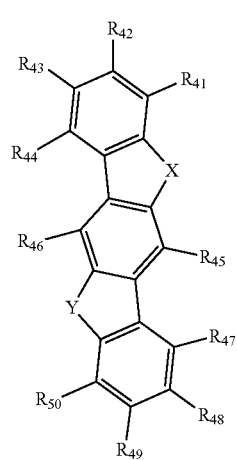

Formula 2-5

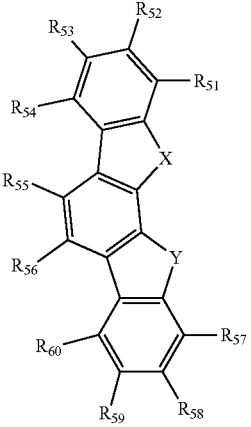

in Formula 1, $R_a$ to $R_d$ are each independently a hydrogen atom, a deuterium atom, a halogen atom, a substituted or unsubstituted silyl group, a substituted or unsubstituted germanium group, a substituted or unsubstituted alkyl group of 1 to 20 carbon atoms, a substituted or unsubstituted aryl group of 6 to 30 ring carbon atoms, or a substituted or unsubstituted heteroaryl group of 2 to 30 ring carbon atoms, "a" and "b" are each independently an integer of 0 to 7, and "c" and "d" are each independently an integer of 0 to 4, in Formula 2-1 to Formula 2-5, any one among X and Y is $NR_1$, and the remainder is $CR_2R_3$ or $SiR_4R_5$, and $R_1$ to $R_5$, and $R_{11}$ to $R_{60}$ are each independently a hydrogen atom, a deuterium atom, a halogen atom, a substituted or unsubstituted silyl group, a substituted or unsubstituted alkyl group of 1 to 20 carbon atoms, a substituted or unsubstituted hydrocarbon ring of 6 to 30 ring carbon atoms, or a substituted or unsubstituted heterocycle of 2 to 30 ring carbon atoms.

15. The organic electroluminescence device of claim 14, wherein a weight ratio of the first host and the second host is 50:40 to 80:10.

16. The organic electroluminescence device of claim 14, wherein the emission layer is configured to emit green light.

17. A method of manufacturing an organic electroluminescence device, the method comprising:

forming a hole transport region on a first electrode;

forming an emission layer comprising a first host, a second host and a dopant, on the hole transport region;

forming an electron transport region on the emission layer; and forming a second electrode on the electron transport region, wherein the first host is represented by the following Formula 1 and the second host is represented by any one among the following Formula 2-1 to Formula 2-5:

Formula 1

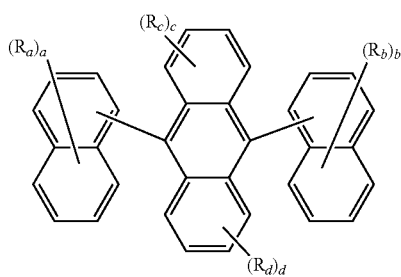

Formula 2-1

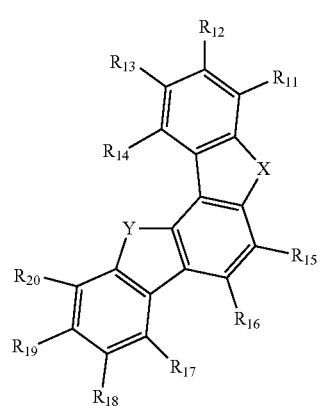

Formula 2-2

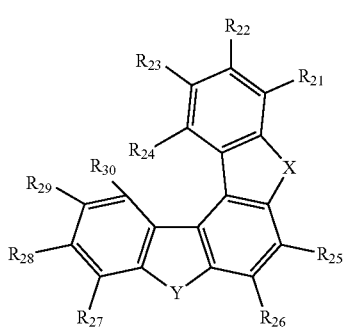

Formula 2-3

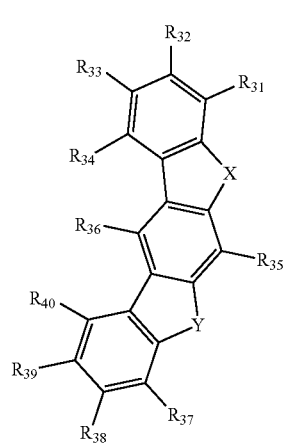

Formula 2-4

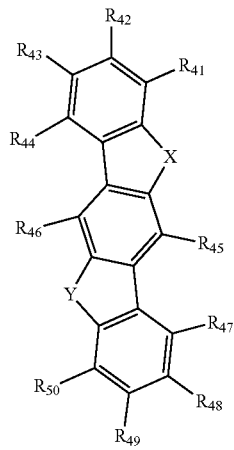

Formula 2-5

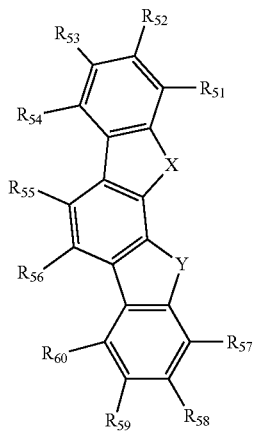

in Formula 1, $R_a$ to $R_d$ are each independently a hydrogen atom, a deuterium atom, a halogen atom, a substituted or unsubstituted silyl group, a substituted or unsubstituted germanium group, a substituted or unsubstituted alkyl group of 1 to 20 carbon atoms, a substituted or unsubstituted aryl group of 6 to 30 ring carbon atoms, or a substituted or unsubstituted heteroaryl group of 2 to 30 ring carbon atoms, "a" and "b" are each independently an integer of 0 to 7, and "c" and "d" are each independently an integer of 0 to 4, in Formula 2-1 to Formula 2-5, X and Y are each independently $NR_1$, $CR_2R_3$, or $SiR_4R_5$, provided that one of X and Y is $NR_1$, $R_1$ to $R_5$ and $R_{11}$ to $R_{60}$ are each independently a hydrogen atom, a deuterium atom, a halogen atom, a substituted or unsubstituted silyl group, a substituted or unsubstituted alkyl group of 1 to 20 carbon atoms, a substituted or unsubstituted hydrocarbon ring of 6 to 30 ring carbon atoms, or a substituted or unsubstituted heterocycle of 2 to 30 ring carbon atoms.

18. The method of manufacturing an organic electroluminescence device of claim 17, wherein the forming of the emission layer comprises:

mixing the first host and the second host to prepare a mixed host; and co-depositing the mixed host and the dopant.

19. The method of manufacturing an organic electroluminescence device of claim 18, wherein the mixed host includes the first host and the second host in a weight ratio of 50:40 to 80:10.

20. The method of manufacturing an organic electroluminescence device of claim 18, wherein a weight ratio of the mixed host to the dopant is 59:41 to 95:5.

* * * * *